United States Patent
Nakanishi

(10) Patent No.: US 8,138,996 B2
(45) Date of Patent: Mar. 20, 2012

(54) ELECTRO-OPTICAL DEVICE, METHOD OF MANUFACTURING THE SAME, AND ELECTRONIC APPARATUS WITH OVERLAPPING ELECTRODE AND POWER SOURCE LINE

(75) Inventor: Hayato Nakanishi, Toyama (JP)

(73) Assignee: Seiko Epson Corporation, Tokyo (JP)

( * ) Notice: Subject to any disclaimer, the term of this patent is extended or adjusted under 35 U.S.C. 154(b) by 653 days.

(21) Appl. No.: 11/604,739

(22) Filed: Nov. 28, 2006

(65) Prior Publication Data

US 2007/0069997 A1    Mar. 29, 2007

Related U.S. Application Data

(63) Continuation of application No. 10/444,987, filed on May 27, 2003, now Pat. No. 7,158,103.

(30) Foreign Application Priority Data

May 31, 2002   (JP) ................ 2002-160246

(51) Int. Cl.
| | |
|---|---|
| G09G 3/30 | (2006.01) |
| G09G 3/10 | (2006.01) |
| H01J 1/62 | (2006.01) |
| H01J 63/04 | (2006.01) |
| H01L 27/14 | (2006.01) |
| H01L 29/04 | (2006.01) |
| H01L 29/15 | (2006.01) |
| H01L 31/036 | (2006.01) |

(52) U.S. Cl. .......... 345/76; 313/483; 313/498; 313/500; 313/504; 313/505; 257/72; 315/169.3

(58) Field of Classification Search .............. 345/36–50, 345/204–206, 87–93, 80, 84; 313/483–512; 315/169.3, 169.4, 32; 257/72
See application file for complete search history.

(56) References Cited

U.S. PATENT DOCUMENTS

| | | | |
|---|---|---|---|
| 5,526,149 A | 6/1996 | Kanbe et al. | |
| 6,084,579 A * | 7/2000 | Hirano | 345/205 |
| 6,246,179 B1 | 6/2001 | Yamada | |
| 6,310,670 B1 * | 10/2001 | Lee | 349/43 |
| 6,380,672 B1 * | 4/2002 | Yudasaka | 313/504 |
| 6,489,952 B1 * | 12/2002 | Tanaka et al. | 345/205 |
| 6,559,594 B2 | 5/2003 | Fukunaga et al. | |
| 6,597,121 B2 | 7/2003 | Imura | |
| 6,768,260 B2 | 7/2004 | Fukunaga et al. | |
| 6,828,726 B2 | 12/2004 | Sakurai et al. | |
| 6,864,638 B2 | 3/2005 | Ishihara et al. | |
| 6,956,324 B2 | 10/2005 | Yamazaki | |
| 7,101,242 B2 | 9/2006 | Fukunaga et al. | |
| 7,157,784 B2 | 1/2007 | Mitros et al. | |

(Continued)

FOREIGN PATENT DOCUMENTS

EP    1 122 800 A2    8/2001

(Continued)

*Primary Examiner* — Sumati Lefkowitz
*Assistant Examiner* — David Tung
(74) *Attorney, Agent, or Firm* — Oliff & Berridge, PLC

(57) ABSTRACT

A light-emitting device and an electronic apparatus, which are capable of preventing reduction of the amount of current flowing through light-emitting elements and which have an excellent display characteristic, are provided. Cathode wiring lines connected to a cathode are provided to surround an effective area outside the effective area where a plurality of pixels having light-emitting elements are provided. First to third power source lines connected to pixel electrodes are provided between the cathode wiring lines and the effective area.

22 Claims, 14 Drawing Sheets

U.S. PATENT DOCUMENTS

| | | |
|---|---|---|
| 2001/0011868 A1* | 8/2001 | Fukunaga et al. ............. 313/506 |
| 2001/0038367 A1* | 11/2001 | Inukai .............................. 345/76 |
| 2002/0011783 A1* | 1/2002 | Hosokawa .................... 313/504 |
| 2002/0024298 A1 | 2/2002 | Fukunaga |
| 2002/0038998 A1* | 4/2002 | Fujita et al. ................... 313/495 |
| 2002/0180671 A1 | 12/2002 | Inukai |
| 2005/0127372 A1 | 6/2005 | Ishihara et al. |
| 2006/0014465 A1 | 1/2006 | Yamazaki |
| 2006/0017380 A1 | 1/2006 | Fukunaga et al. |
| 2006/0038488 A1 | 2/2006 | Fukunaga et al. |
| 2007/0080918 A1 | 4/2007 | Kawachi et al. |
| 2007/0197118 A1 | 8/2007 | Fukunaga et al. |

FOREIGN PATENT DOCUMENTS

| | | |
|---|---|---|
| EP | 1 324 109 A1 | 7/2003 |
| JP | A-10-214042 | 8/1998 |
| JP | A-2001-267086 | 9/2001 |
| JP | A-2001-291595 | 10/2001 |
| JP | A-2002-202735 | 7/2002 |
| JP | A-2002-252087 | 9/2002 |
| JP | A-2003-168570 | 6/2003 |
| JP | A-2003-229283 | 8/2003 |
| JP | A-2003-303687 | 10/2003 |
| JP | A-2002-117971 | 4/2004 |

* cited by examiner (a)

(b)

(c)

(d)

(a)

(b)

(a)

(b)

(a)

(b)

(a)

(b)

(c)

(d)

ELECTRO-OPTICAL DEVICE, METHOD OF MANUFACTURING THE SAME, AND ELECTRONIC APPARATUS WITH OVERLAPPING ELECTRODE AND POWER SOURCE LINE

CROSS-REFERENCE TO RELATED APPLICATION

This is a Continuation of application Ser. No. 10/444,987, filed May 27, 2003. This application claims the benefit of Japanese Patent Application No. 2002-160246 filed May 31, 2002. The disclosures of the prior applications are incorporated by reference herein in their entirety.

BACKGROUND OF THE INVENTION

1. Field of Invention

The present invention relates to an electro-optical device, a method of manufacturing the same, and an electronic apparatus.

2. Description of Related Art

A related art electro-optical device, such as an electroluminescence (hereafter "EL") display device, etc., has a structure in which plural circuit elements, anodes, an electro-optical material, such as an EL material, and cathodes are laminated on a substrate, and sealed by fitting them between sealing substrates. More specifically, the device is made by putting a light-emitting layer including a light-emitting material between electrode layers of anodes and cathodes, and the device utilizes a phenomenon of emitting light when the hole injected from anode sides are re-combined with an electron injected from a cathode sides in a light-emitting layer which has an ability of fluorescence, so that they lose their energy from an excitation state.

Such an electro-optical device includes a device that emits light emitted from the light-emitting layer on an opposite side to a substrate through the cathodes by using beam penetration effect of the cathodes. In this type of device, ITO (Indium Tin Oxide) is used due to a large work function and good performance as the anodes. However, since this material is transparent, a metal layer having reflexibility, such as Ag or Al, is provided as a base layer of the substrate.

However, the related art electro-optical device should form the metal layer as the base layer in order to form the anodes with reflectivity, thereby complicating manufacturing processes. As a result, manufacturing efficiency deteriorates and the manufacturing cost is expensive.

Further, according to this configuration, in order to provide reflexibility to the anodes having good display properties while the light is not transmitted to the lower part of the anodes, the anodes should be flat. Therefore, it is difficult to efficiently use the space of the lower part in the hole.

SUMMARY OF THE INVENTION

The present invention provides an electro-optical device, a method of manufacturing the same, and an electronic apparatus to enhance display performance of the electro-optical device at low cost, which reflects the light emitted from a light-emitting layer to one electrode layer opposite to a substrate.

In order to address or solve the above, an electro-optical device of the present invention includes: first electrodes connected to switching elements; a second electrode arranged to oppose the first electrodes; light-emitting layers provided between the first electrodes and the second electrode; pixel display parts to regulate the light emitted from the light-emitting layers to the second electrode; a circuit layer provided under the first electrodes, the circuit layer having a laminated structure including at least the switching elements and power source lines to drive the light-emitting layers; and metal parts provided at positions overlapping the pixel display parts in the direction of lamination within the circuit layer, the metal parts reflecting the light emitted from the corresponding light-emitting layer.

According to such an electro-optical device, among the light beams emitted downwardly from the light-emitting layer, the light beams transmitted through the first electrode are upwardly reflected at the metal part provided in the circuit layer and are emitted upwardly via the light-emitting layer, the pixel display part, and the second electrode.

Accordingly, the light from the light-emitting layer can be emitted toward the second electrode without giving reflexibility to the first electrode. Further, since it is unnecessary to transmit the light through a lower part of the metal part, it is possible to efficiently use the space thereof.

Further, it is preferable that the electro-optical device of the present invention is any one of the abovementioned electro-optical devices, where the metal parts are provided at positions overlapping substantially the entire display area of each pixel display part.

According to an such electro-optical device, since the light emitted and transmitted downwardly through the first electrode is reflected within the range of the entire display area of the pixel display part, the use efficiency of light and the display performance can be enhanced.

Further, it is preferable that the electro-optical device of the present invention is any one of the abovementioned electro-optical devices, where the surfaces of the metal parts are flatly formed within the overlapping region with the pixel display parts.

According to such an electro-optical device, since the surfaces of the metal parts are flatly formed within the overlapping region with the pixel display parts, the light is uniformly reflected. As a result, the use efficiency of light and the display performance can be more enhanced.

Further, it is preferable that the electro-optical device of the present invention is any one of the abovementioned electro-optical devices, where layers below the metal parts in the circuit layer are formed in a beta-shaped pattern having a predetermined layer thickness within the overlapping region with the pixel display parts.

According to such an electro-optical device, any one of the layers under the metal parts, which are formed in a beta-shaped pattern having a predetermined layer thickness, is flat within the overlapping region with the pixel display part. Since the metal part is formed on an upper layer in a beta-shaped pattern, flatness of the metal part is remarkably enhanced within the range of the pixel display part. As a result, reflection nonuniformity of the light is more reduced or suppressed and the use efficiency of light with display performance can be remarkably enhanced.

Moreover, a predetermined range of beta-shaped pattern means that a certain thickness of layer is made of a single layer material within the predetermined range.

Further, it is preferable that the electro-optical device of the present invention is any one of the abovementioned electro-optical devices, where power source lines to supply electricity to the switching elements also serve as the metal parts.

According to such an electro-optical device, since the power source lines are provided in the overlapping region with the pixel display parts, it is possible to ensure the area of the power source line at least as large as the pixel display part and to form a relatively large electrostatic capacitor between the power source line and the second electrode. As a result, the display property can be stably secured and the display characteristics can be enhanced.

Further, it is preferable that the electro-optical device of the present invention is any one of the abovementioned electro-optical devices, where the circuit layer has a first metal layer and a second metal layer on the first metal layer, and the second metal layer constitutes the metal parts.

According to such an electro-optical device, since the metal part is formed in the circuit layer by the upper second metal layer nearer to the first electrode than the first metal layer, the distance between the first electrode and the metal part can be made shorter than that between the first metal layer and the metal part. Further, the optical loss generated when the light from the light-emitting layer travels between the first electrode and the metal part, can be reduced. As a result, the use efficiency of light can be enhanced.

Moreover, since the second metal layer forms the metal part, thereby to reflect the light from the light-emitting layer upwardly, the circuit layer under the second metal layer becomes a space through which where the light does not have to be transmitted. Compared when the first metal layer forms the metal part, the efficiently available space can be thicker in the direction of lamination.

Further, it is preferable that the electro-optical device of the present invention is the abovementioned electro-optical device, where the second metal layer constitutes the power source lines to supply electricity to the switching elements.

According to such an electro-optical device, since the second metal layer constituting the power source lines to supply current to the switching elements forms the metal part, the process of manufacturing the metal part can be also used as a manufacturing process essential for forming the circuit layer. As a result, the manufacturing cost can be reduced.

Further, it is preferable that the electro-optical device of the present invention is the same abovementioned electro-optical device wherein the first electrodes are provided on the metal parts, and they are electrically connected to each other.

According to such an electro-optical device, since the circuit layer, such as an insulating layer, is not included between the metal part and the first electrode, there is no optical loss when the light is transmitted through the circuit layer. Therefore, the use efficiency of light can be enhanced.

Furthermore, since an insulating layer from the first electrode is not provided on the second metal layer, the manufacturing process can be simplified, the manufacturing cost can be reduced, and the productivity can be enhanced.

Further, it is preferable that the electro-optical device of the present invention is the same abovementioned or the just abovementioned electro-optical device, where the first metal layer constitutes the power source lines to supply electricity to the switching elements.

According to such an electro-optical device, since the first metal layer constitutes the power source lines, it is possible to easily use the second metal layer for various purposes other than for the power source line while ensuring a wider power source line.

Particularly, the potential of the metal part formed on the second metal layer can be freely set, and a configuration that does not cause a short circuit can be remarkably easily made, even though the metal part abuts the first electrode with no insulating layer.

Further, it is preferable that the electro-optical device of the present invention is any one of the abovementioned electro-optical devices, where the switching elements are disposed between the adjacent pixel display parts.

According to an such electro-optical device, since the switching elements are disposed between the adjacent pixel display parts in the circuit layer, there is no possibility that the flatness of the pixel display part does not deteriorate due to a cubic shape of the switching element. For this reason, it is possible to flatly form the pixel display part with ease.

Further, it is preferable that the electro-optical device of the present invention is any one of the abovementioned electro-optical devices, where electrostatic capacitors are formed in the circuit layer between the power source lines and the second electrode at position overlapping the pixel display parts, the capacitors being formed by the layers below the metal parts.

According to such an electro-optical device, since the electrostatic capacitor is formed in the layers below the metal part located under the pixel display part, the electrostatic capacitor can be formed by efficiently using a space under the pixel display part. As a result, an area where the electrostatic capacitor is formed can be increased, so that the display can be stably held and the display property can be enhanced.

Next, a method of manufacturing an electro-optical device of the present invention includes a circuit layer having a laminated structure; and first electrodes, light-emitting layers, and a second electrode sequentially provided on the circuit layer, the electro-optical device emitting light from the second electrode via pixel display parts to regulate, above the light-emitting layers, the light emitted from the light-emitting layers. The method including forming a metal layer in the circuit layer. Metal parts are formed under the light-emitting layers simultaneously with the metal layer forming step.

According to the method of manufacturing the electro-optical device, the aforementioned electro-optical devices according to the present invention can be manufactured. Accordingly, the same effect as the electro-optical device of the present invention can be achieved.

Further, it is preferable that the method of manufacturing the electro-optical device of the present invention is the manufacturing method of the electro-optical device described above, and the metal layer formation step includes a first metal layer formation step of forming a first metal layer in the circuit layer, and a second metal layer formation step of forming a second metal layer after the first metal layer is formed, and metal parts are formed under the light-emitting layers simultaneously with the second metal layer formation step.

According to such a method of manufacturing the electro-optical device, it is possible to manufacture the aforementioned electro-optical devices according to the present invention, including the first metal layer and the second metal layer in the circuit layer. Therefore, the same effect as the electro-optical device of the present invention can be achieved.

Next, an electronic apparatus of the present invention includes the electro-optical device of the present invention.

Examples of an electronic apparatus include: mobile phones, mobile information terminals, watches, and information processing devices, such as word processors and personal computers, etc., for example. By adopting the electro-optical device of the present invention into a display part of such electronic apparatuses, it is available to provide an electronic apparatus whose display performance is enhanced at low cost.

DETAILED DESCRIPTION OF PREFERRED EMBODIMENTS

Exemplary embodiments of an electro-optical device, a manufacturing for the same, and an electronic apparatus according to the present invention according the present invention are described below with reference to the drawings. Further, the exemplary embodiments simply represent one aspect of the present invention. This invention is not limited to the exemplary embodiments, but may be freely modified within the scope of the technical spirit of the present invention. Moreover, since the respective layers or the respective members have recognizable sizes in the respective drawings, which will be referred to in the following description, the respective layers or the respective members are represented in different scales.

First Exemplary Embodiment

Figure 1:
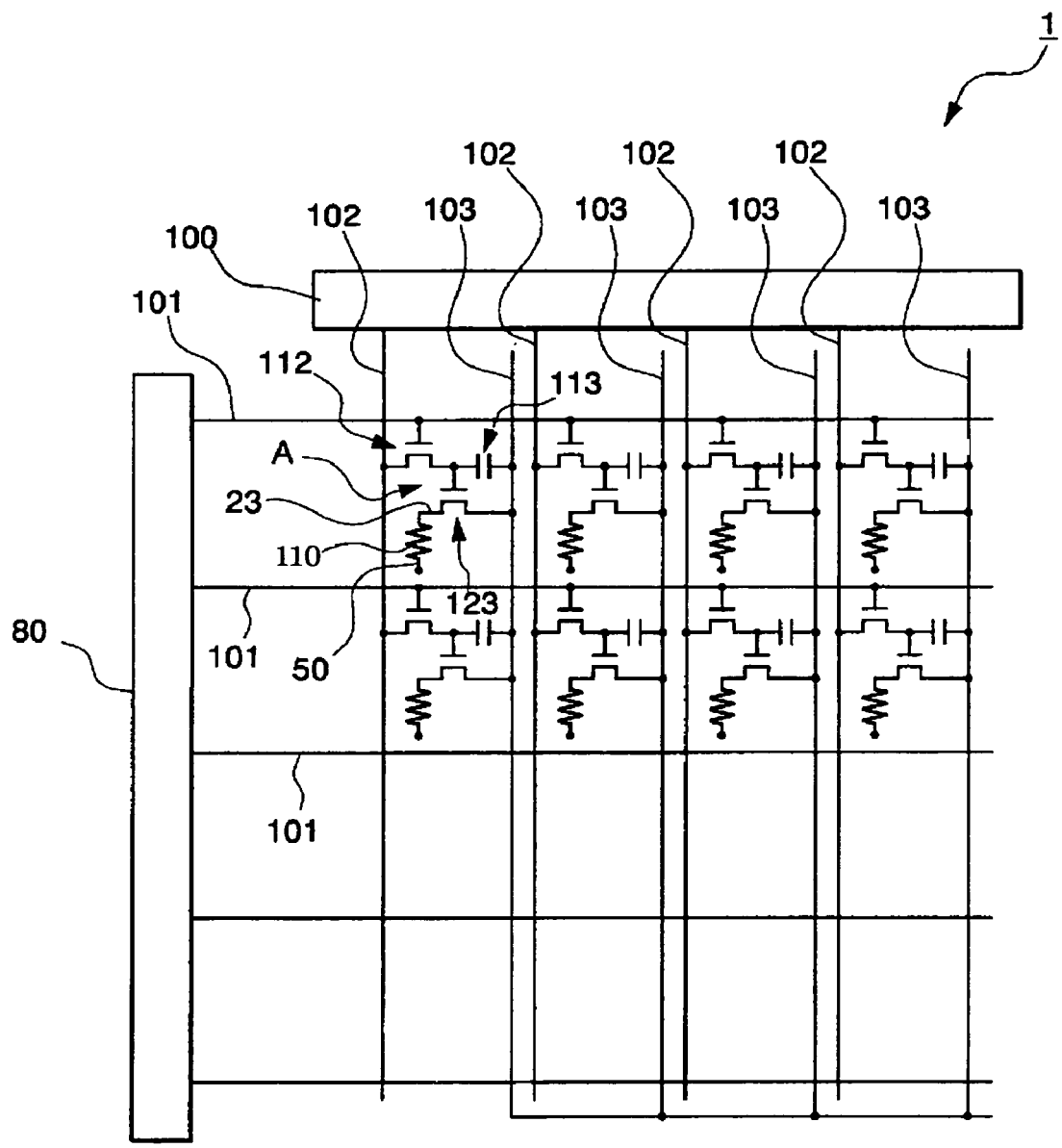
FIG. 1 is a schematic illustrating an equivalent circuit and a wiring structure of an EL display device according to a first exemplary embodiment of the present invention.

As a first exemplary embodiment of the electro-optical device according to the present invention, an EL display device is described which uses an organic EL material among electroluminescence type materials as an example of an electro-optical material. FIG. 1 is a schematic illustrating an equivalent circuit and a wiring structure of an EL display device according to the present exemplary embodiment.

An EL display device (electro-optical device) 1 shown in FIG. 1 is an active matrix type EL display device using a thin film transistor (hereinafter "TFT") as a switching element.

As shown in FIG. 1, the EL display device 1 includes: a plurality of scanning lines 101; a plurality of signal lines 102 extending in the direction of perpendicularly intersecting each scanning line 101; and a plurality of power source lines 103 extending parallel to each signal line 102. Further, a pixel region A is arranged around each intersection between the scanning lines 101 and the signal lines 102.

A data line driving circuit 100, which includes a shift register, a level shifter, a video line, and an analog switch, is connected to the signal lines 102. A scanning-line driving circuit 80, which includes a shift register and a level shifter, connected to the scanning lines 101.

Each pixel region A is provided with a switching TFT (switching element) 112 where scanning signals are supplied to gate electrodes via the scanning lines 101; a storage capacitor (electrostatic capacitor) 113 to hold pixel signals shared from the signal lines 102 via the switching TFT 112; a driving TFT (switching element) 123 where the pixel signals held by the storage capacitor 113 are supplied to the gate electrodes; an anode (first electrode) 23 into which driving current flows from the power source lines 103 when electrically connected to the power source line 103 via the driving TFT 123; and a functional layer (light-emitting layer) 110 which is sandwiched between the anode 23 and a cathode (second electrode) 50. The anodes 23, the cathode 50, and the functional layer 110 constitute a light-emitting element.

According to the EL display device 1, when the scanning line 101 is driven to turn on the switching TFT 112, potential of the signal line 102 is held by the storage capacitor 113 and an on/off state of the driving TFT 123 is determined in accordance with a state of the corresponding storage capacitor 113. Further, current flows into the anode 23 from the power source line 103 via a channel of the driving TFT 123, and then flows into the cathode 50 via the functional layer 110. The functional layer 110 emits light in accordance with the amount of the current flowing therethrough. Thus, since on/off operation of each anode 23 is controlled for the light emission, the anode 23 is composed of a pixel electrode.

Figure 2:
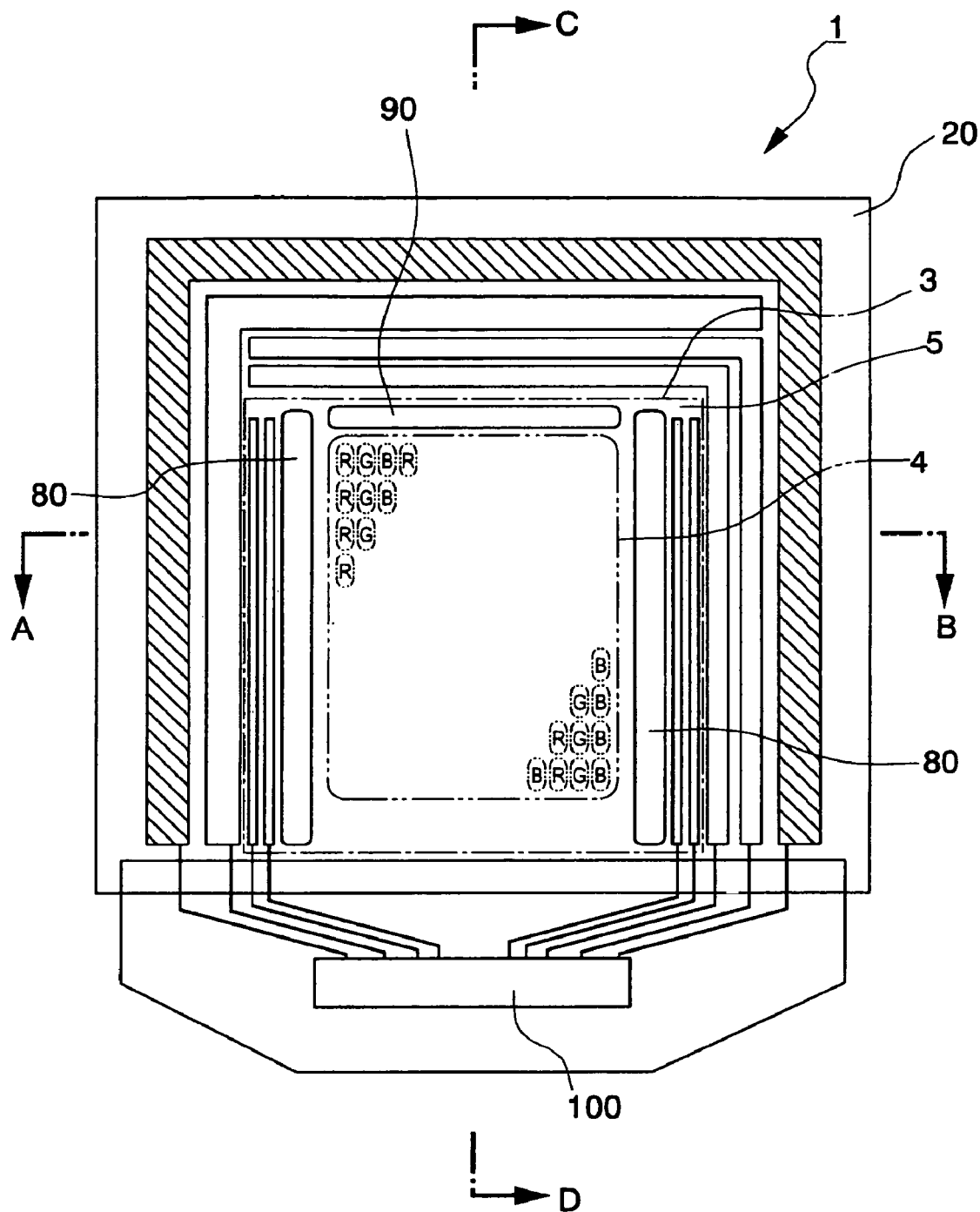
FIG. 2 is a plan view illustrating a configuration of an EL display device according to a first exemplary embodiment of the present invention.
Figure 3:
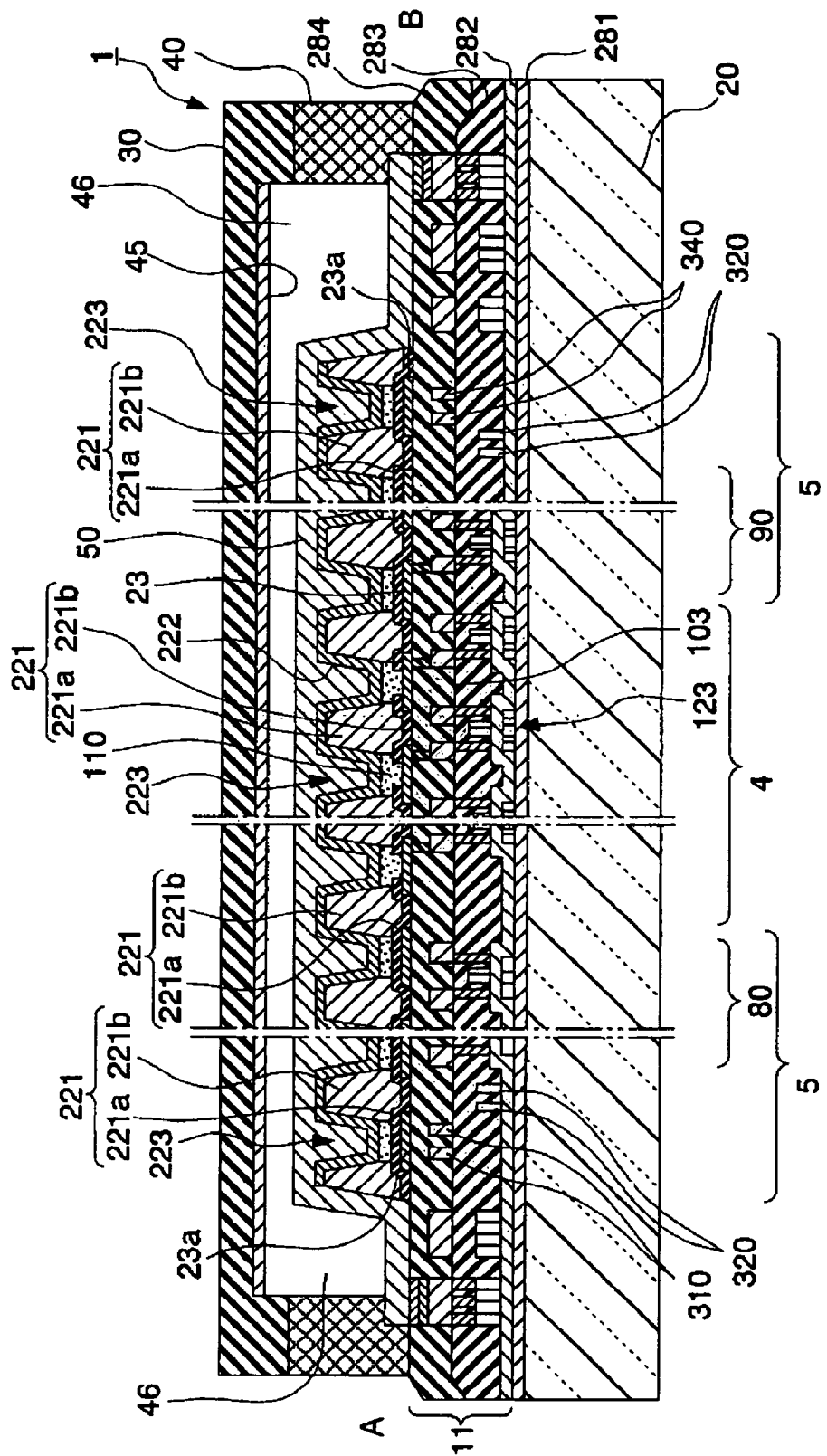
FIG. 3 is a sectional view taken along the Plane A-B of FIG. 2.
Figure 4:
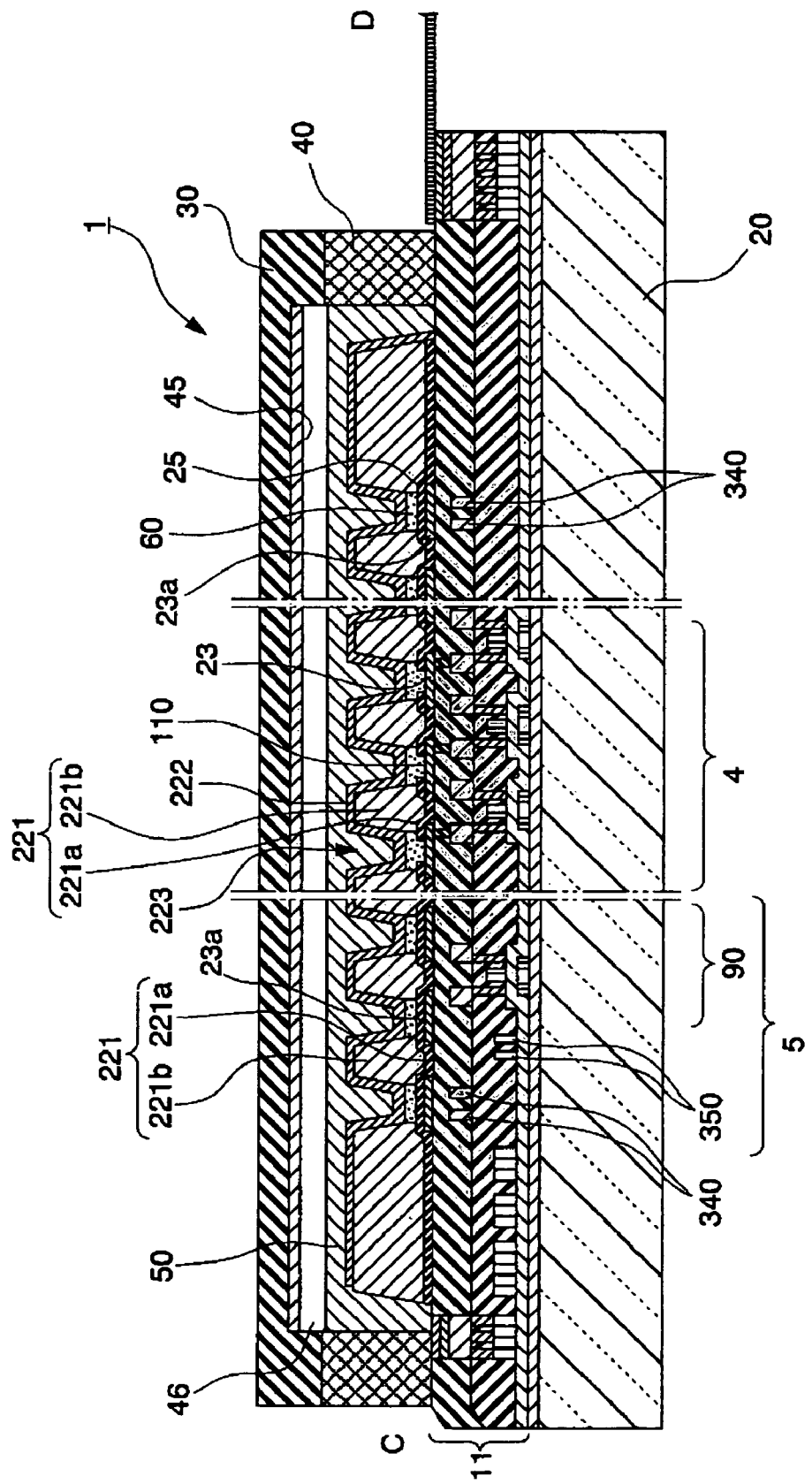
FIG. 4 is a sectional view taken along the Plane C-D of FIG. 2.

A specific aspect of the EL display device 1 according to the present exemplary embodiment is described below with reference to FIG. 2 to FIG. 4. FIG. 2 is a plan view illustrating a configuration of the EL display device 1. FIG. 3 is a sectional view taken along Plane A-B of FIG. 2. FIG. 4 is a sectional view taken along Plane C-D of FIG. 2.

The EL display device 1 of the present exemplary embodiment illustrated in FIG. 2 includes: a substrate 20 having an electric insulating property; a pixel electrode region (not shown) where pixel electrodes connected to switching TFTs (not shown) are disposed in a matrix on the substrate 20; power source lines 103 arranged around the pixel electrode region and connected to each pixel electrode; and a pixel part 3 (within a frame indicated by one-dotted chain line in the drawing) formed in a substantially rectangular shape in a plan view and located at least on the pixel electrode region. The pixel part 3 is partitioned into a central substantial display region 4 (within a frame indicated by two-dotted chain line in the drawing) and a dummy region (region between the one-dotted chain line and the two-dotted chain line) 5 arranged around the substantial display region 4.

In the substantial display region 4, display regions (R, G, B) are disposed in a matrix so as to have a pixel electrode, respectively, and to correspond to three primary colors of red, green, and blue. To A-B direction, the display regions (R, G, B) are repeatedly arranged in a separated way. To C-D direction, display regions corresponding to the same color are separately arranged.

Further, scanning-line driving circuits 80 are disposed on both sides of the substantial display region 4 in the drawing. The scanning-line driving circuits 80 are positioned under the dummy region 5.

Moreover, an inspection circuit 90 is disposed at an upper part of the substantial display region 4 in the drawing. The inspection circuit 90 is positioned under the dummy region 5. The inspection circuit 90 inspects an operational state of the EL display device 1. For instance, the inspection circuit has inspected result output means (not shown) to output an inspected result to the outside, and it is configured to be capable of inspecting the quality and defects of a display device during the manufacture or shipment thereof.

Driving voltages of the scanning-line driving circuits 80 and the inspection circuit 90 are applied via driving voltage continuity parts 310 (see FIG. 3) and driving voltage continuity parts 340 (see FIG. 4). Further, driving control signals and the driving voltages to the scanning-line driving circuits 80 and the inspection circuit 90 are transmitted and applied via driving control signal continuity parts 320 (see FIG. 3) and driving voltage continuity parts 350 (see FIG. 4) composed of predetermined main drivers for controlling an operation of the EL display device 1. In this case, the driving control signals are command signals from the main drivers related to the control when the scanning-line driving circuits 80 and the inspection circuit 90 output signals.

As shown in FIG. 3 and FIG. 4, in the EL display device 1, a substrate 20 and a sealing substrate 30 are adhered together via a sealing resin 40. A drying agent 45 having light transmissivity is inserted into a region surrounded by the substrate 20, the sealing substrate 30, and the sealing resin 40. Further, inert gas filling layer 46 filled with inert gas such as nitrogen gas is formed in the region.

Any kind of plate-shaped members having insulation may be available as the substrate 20 only if they can form an electronic circuit by providing a silicon layer on the substrate 20. It is unnecessary for the members to have light transmissivity.

For instance, the sealing substrate 30 can adopt a plate-shaped member having light transmissivity and electric insulation, such as glass, quartz, or plastics.

Further, the sealing resin 40 is composed of thermosetting resin or ultraviolet curable resin, and in particular, it is preferable that the sealing resin be composed of epoxy resin, which is a kind of the thermosetting resin.

Further, the substrate 20 has thereon formed a circuit part (circuit layer) 11 having a laminated structure including driving TFTs 123 for driving anodes 23. Each of the anodes 23 connected to the driving TFTs 123 is formed on the circuit part 11 so as to correspond to positions of the display regions (R, G, B) of FIG. 2. The functional layer 110 is formed on each anode 23 within a substantial display region 4. A buffer layer 222 to facilitate electron injection and a cathode 50 to perform the electron injection are formed on each anode 23. Banks 221 and an oval pixel display part 26 are formed between each anode 23. An inorganic bank layer 221*a* and an organic bank layer 221*b* are laminated on the banks 221 from the substrate 20 to A-B direction and C-D direction in FIG. 2. The oval pixel display part 26 partitions the functional layer 110, and regulates light emitted from the partitioned functional layer 110.

Further, in a dummy region 5, the inorganic bank layer 221*a* covers each dummy anode 23*a*, and the functional layer 110 is provided on an upper layer thereof. The dummy anodes 23*a* are configured in the same way as the anodes 23, exception for being not connected to wiring of the circuit part 11.

By disposing the dummy region 5 around the substantial display region 4, it is possible to uniform the thickness of the functional layer 110 in the substantial display region 4, and to suppress display nonuniformity.

That is, by disposing the dummy region 5, drying conditions of discharged compositions can be made regular within the substantial display region 4 in case that display elements are formed by an ink-jet method. Further, there is no problem that the deviation in the thickness of the functional layer 110 may occur at the peripheral edge of the substantial display region 4.

Furthermore, the circuit part 11 includes the scanning-line driving circuits 80, the inspection circuit 90, the driving voltage continuity parts 310, 340, 350 to drive the circuits by connecting them, and the driving control signal continuity parts 320.

The anodes 23 have a function to inject holes into the functional layer 110 by applied voltages. The anodes 23 can adopt ITO (Indium Tin Oxide) and the like having excellent injection performance of the holes with an increased work function.

As for the functional layer 110, any configurations are available if only it has a light-emitting layer. For instance, the functional layer can adopt a configuration comprising: a hole injection/transport layer 70 (see FIG. 5(*b*)) having a hole injection layer improving injection efficiency of the holes and a hole transport layer improving transport efficiency of the holes; and an organic EL layer 60 (light-emitting layer in FIG. 5(*b*)), sequentially from the anodes 23. By positioning the hole injection/transport layer 70 between the anode 23 and the organic EL layer 60, element characteristics such as luminous efficiency or life span of the organic EL layer 60 can be improved. Further, in the organic EL layer 60, the holes injected via the hole injection/transport layer 70 from the anode 23 are combined with electrons injected from the cathode 50 to generate fluorescence.

As materials for forming the hole injection layer, for example, poly-thiophene derivatives, polypyrrole derivatives, or doping materials can be used. For instance, as the poly-thiophene derivatives, PEDOT:PSS in which PEDOT is doped with PSS (Polystyrene sulfone acid) can be adopted. As a more specific example, a kind of the PEDOT:PSS, bytron-p (made by Bayer AG) can be properly used.

As materials for forming the hole transport layer, any related art or known materials for hole transport may be possible if only they can transport the holes. For example, various organic materials classified into amine, hydrazone, stilbene, and starburst series are known as such materials.

As materials for forming the organic EL layer 60, any known light-emitting materials capable of emitting fluorescence or phosphorescence are available. More specifically, there are proper materials, such as poly-fluorene derivatives (PF), poly-paraphenylenevinylene derivatives (PPV), polyphenylene derivatives (PP), polyparaphenylene derivatives (PPP), polyvinyl carbazole (PVK), poly-thiophene derivatives, and polysilane series such as polymethyl phenylsilane (PMPS).

Further, it is possible to dope high polymer materials with high polymer series material, such as perylene series pigment, coumarin series pigment, and rhodamine series pigment, or material, such as rubrene, perylene, 9,10-diphenylanthracene, tetraphenylbutadiene, Nile red, coumarin 6, and quinacridon.

Next, both the inorganic bank layer 221*a* and the organic bank layer 221*b* forming the bank 221 are formed to bulge at the peripheral edge of the anode 23. The inorganic bank layer 221a is formed to extend more toward the central side than the anode 23, compared to the organic bank layer 221b. The bank 221 may be configured with materials not to transmit light or it may be configured to regulate the light by disposing a light-shielding layer between the inorganic bank layer 221a and the organic bank layer 221b.

For instance, the inorganic bank layer 221a can adopt inorganic materials such as $SiO_2$, $TiO_2$, and SiN. It is preferable to form the film thickness of the inorganic bank layer 221a within the range of 50 to 200 nm, and particularly, approximately 150 nm is the best. When the film thickness is less than 50 nm, the inorganic bank layer 221a can be thinner than the hole injection/transport layer 70, and thus it cannot secure flatness of the hole injection/transport layer 70. If the film thickness exceeds 200 nm, step difference by the inorganic bank layer 221a get bigger, and thus it is impossible to obtain flatness of the organic EL layer 60.

The organic bank layer 221b is formed of common resist, such as acryl resin and polyimide resin. It is preferable to form the thickness of the organic bank layer 221b within the range of 0.1 to 3.5 µm, and particularly, approximately 2 µm is the best. If the thickness is less than 0.1 µm, it is not preferable since the thickness of the organic bank layer 221b is thinner than that of the functional layer 110.

Further, if the thickness exceeds more than 3.5 µm, the step difference by the banks gets bigger. Thus, it is impossible to firmly ensure the step coverage of the cathode 50 formed on the organic bank layer 221b. Moreover, if the thickness of the organic bank layer 221b is more than 2 µm, it is more preferable due to the fact that insulation between the anode 23 and the cathode 50 can be increased.

Like the above, the functional layer 110 is formed to be thinner than the bank 221.

Further, a region showing a lyophilic property and a region showing a lyophobic property are formed around the bank 221.

The inorganic bank layer 221a and the anode 23 are the region showing a lyophilic property, and this region introduces a lyophilic group, such as a hydroxyl group, by a plasma treatment using oxygen as a reaction gas. Further, the organic bank layer 221b is the region showing a lyophobic property, and a lyophobic group, such as fluorine, is introduced by a plasma treatment using 4-fluoromethane as a reaction gas.

Moreover, in the present exemplary embodiment, the lyophilic property of a lyophilic control layer means high lyophilic properties, compared to acryl and polyimide materials constituting at least the organic bank layer 221b.

As shown in FIG. 3 or FIG. 4, the cathode 50 has a larger area than the total area of the substantial display region 4 and the dummy region 5, and the cathode is formed in such a manner to cover them. The cathode 50 has a function to inject electrons into the functional layer 110 as an electrode opposite to the anode 23. Further, in the present exemplary embodiment, the light emitted from the functional layer 110 is taken out from the cathode 50, so that the cathode is required to have light transmissivity. Therefore, the cathode 50 is made of materials having low work functions as well as having light transmissivity.

For such materials, laminations can be adopted in which a first cathode layer is formed by providing laminations of, for example, lithium fluoride and calcium on the functional layer 110, and a second cathode layer composed of laminations of, for example, Al, Ag, Mg/Ag, etc is formed on the first cathode layer. At that time, light transmissivity can be obtained by making each layer thickness thinner until they have light transmissivity. In the cathode 50, only the second cathode layer extends up to the outside of the pixel part 3.

Moreover, the second cathode layer is provided to cover the first cathode layer to protect it from chemical reactions with oxygen or water, and to increase the conductivity of the cathode 50. Accordingly, if it is chemically stable with a low work function and light transmissivity, it may be a single layer structure and it is not necessarily limited to metal materials. Furthermore, a protective layer made of $SiO_2$ and SiN to prevent oxidation may be provided on the second cathode layer.

Figure 5:
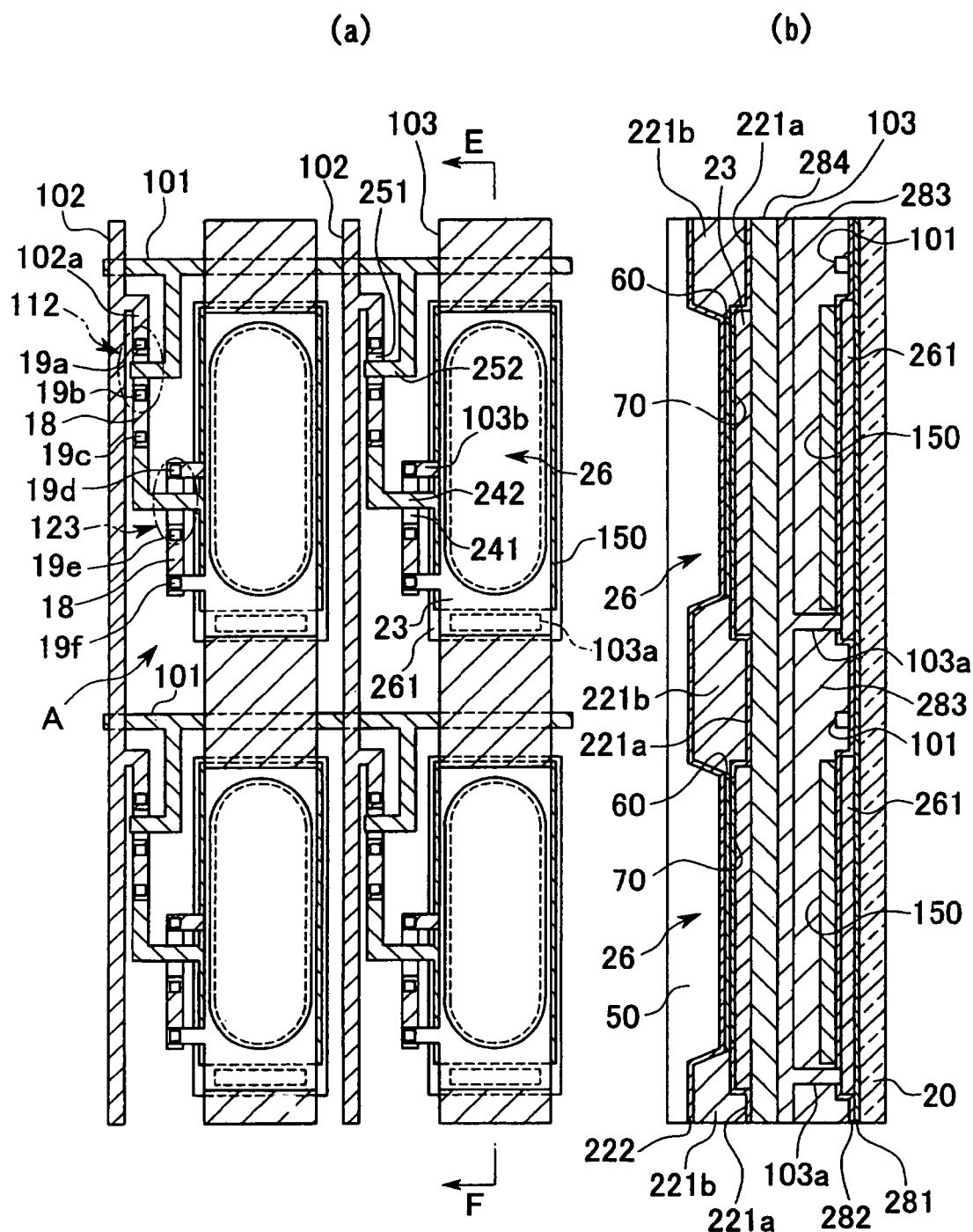
FIGS. 5(a) and 5(b) are a schematic and sectional view as viewed from a plane of four adjacent pixel regions A in a substantial display region according to a first exemplary embodiment of the present invention.
Figure 6:
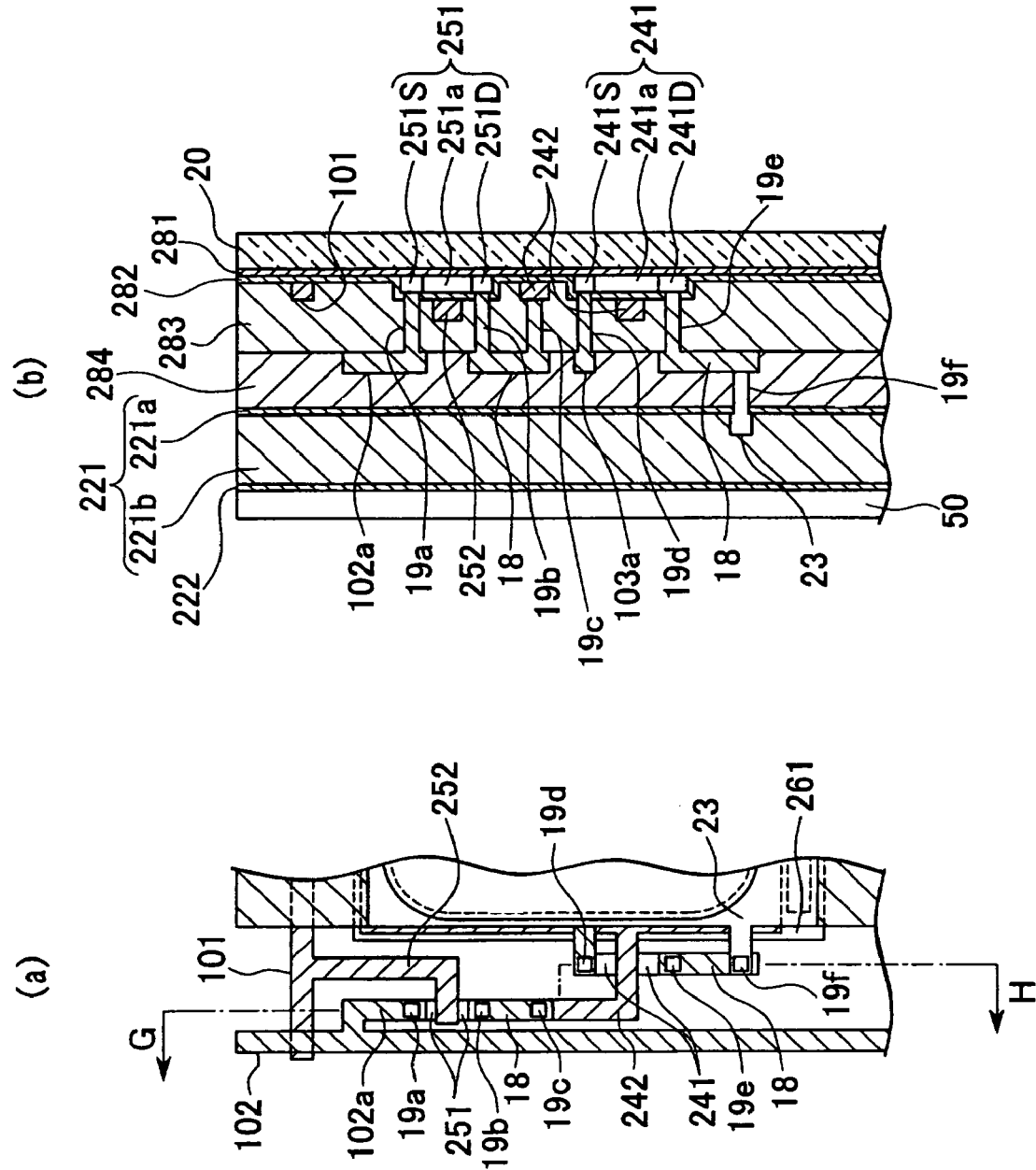
FIGS. 6(a) and 6(b) are a partially enlarged schematic and sectional view as viewed from a plane of FIGS. 5(a) and 5(b)

A laminated structure of the circuit part 11 is described below with reference to FIG. 5(a)-FIG. 6(b). FIG. 5(a) is a schematic as viewed from a plane of four adjacent pixel regions A in the substantial display region 4. FIG. 5(b) is a sectional view as viewed from the direction E-F in FIG. 5(a). FIG. 6(a) is an enlarged schematic around a switching TFT 112 and a driving TFT 123 in FIG. 5(a). FIG. 6(b) is a sectional view taken along Plane G-H of FIG. 6(a). Moreover, each pixel region A has the same laminated structure even though a material of functional layers 110 is different, according to any one of display regions (R, G, B). Thus, one pixel region A will be described below on behalf of the rest pixel regions. Furthermore, since all the arrangements as viewed from the plane of the four pixel regions A are identical to each other, reference numerals are omitted to the parts as considered to be clearly identical in order to more easily refer to the drawing.

As shown in FIG. 5(a), the power source line (metal part) 103 is provided in the pixel region A so as to extend in the direction of intersecting the scanning line 101, under the anode 23 with the width of covering at least an area of the pixel display part 26. The signal line 102 is provided substantially parallel to the power source line 103. The switching TFT 112 is connected to a source electrode wiring line 102a, which is configured to extend as a portion of the signal line 102. A gate electrode 242 of the driving TFT 123 is connected to a drain electrode of the switching TFT 112 through a connection wiring line 18. A gate electrode 252 of the switching TFT 112 is connected to the scanning line 101. The power source line 103 is connected to a source electrode of the driving TFT 123 through a power source wiring line 103b, which is configured as a portion of the power source line 103. The anode 23 is connected to a drain electrode of the driving TFT 123.

Both the switching TFT 112 and the driving TFT 123 are disposed under the bank 221 at a position sandwiched between the signal line 102 and the pixel display part 26. In contrast, the storage capacitor 113 (see FIG. 1) is formed under the pixel display part 26 which is described below.

The position and connection relationships between the above parts in the direction of lamination of the circuit part 11 is described below. As shown in FIG. 5(b), a silicon layer 261 is formed on the surface of the substrate 20, based on a base protective layer 281 mainly composed of $SiO_2$. The silicon layer 261 is formed in an island shape with a larger area than that of the pixel display part 26 at a position overlapping the pixel display part 26 as viewed from the plane. Island-shaped silicon layers 241, 251 are formed on the same layer as the silicon layer 261 to form the driving TFT 123 and the switching TFT 112. The surface of each silicon layer 261, 241, 251 is covered with a gate-insulating layer 282 mainly composed of $SiO_2$ and/or SiN. Moreover, in the present invention, the "main" component indicates a component including the biggest content among the components.

A first metal layer composed of, for example, an aluminum film, a chrome film, a tantalum film, etc., is provided on the gate-insulating layer 282. The first metal layer forms the gate electrodes 242, 252, the scanning line 101, and a condenser electrode 150. The condenser electrode 150 is formed on the silicon layer 261 so as to oppose the silicon layer 261 with an area equal to that of the silicon layer 261 or a slightly smaller area than that thereof.

The top of the first metal layer is covered with a first interlayer insulating layer 283 mainly composed of $SiO_2$.

On top of the first interlayer insulating layer 283, the power source line 103 and the signal line 102 are formed from a second metal layer composed of, for example, an aluminum film, a chrome film, a tantalum film, etc.

The power source line 103 is formed with the thickness having optical reflexibility. Further, the power source line is connected to the silicon layer 261 by a contact hole 103a which is bored in the gate-insulating layer 282 through the first interlayer insulating layer 283, and the power source line is of the same potential as the silicon layer. Accordingly, the power source line 103 and the condenser electrode 150 are configured to oppose each other with the first interlayer insulating layer 283 as an insulating material sandwiched therebetween so as to form an electrostatic capacitor, and the condenser electrode 150 and the silicon layer 261 are configured to oppose each other with the gate-insulating layer 282 as an insulating material sandwiched therebetween so as to form an electrostatic capacitor. These electrostatic capacitors form the storage capacitor 113 (see FIG. 1). More specifically, in the circuit part 11, the storage capacitor 113 is formed on a layer below the power source lines 103 to reflect light, below the pixel display part 26. Further all of the power source line 103, the condenser electrode 150, and the silicon layer 261 to form the storage capacitor 113 are formed in a flat beta-shaped pattern having a predetermined thickness within the range of area of covering at least the pixel display part 26.

The top of the second metal layer is covered with the second interlayer insulating layer 284 mainly composed of acryl-series resin components. The second interlayer insulating layer 284 can use any materials other than an acryl-series insulating film, for example, SiN, $SiO_2$, etc.

A configuration of the switching TFT 112 and the driving TFT 123 is described below with reference to FIGS. 6(a) and 6(b). FIG. 6(a) is an enlarged view around the switching TFT 112 and the driving TFT 123. FIG. 6(b) is a sectional view taken along Plane G-H of FIG. 6(a).

The silicon layer 251 is provided with a source region 251S, a channel region 251a, and a drain region 251D. Moreover, the source region 251S and the drain region 215D have a gradient of concentration, so called a light doped structure (LDD). The source region 251S is connected to the source electrode wiring line 102a via a contact hole 19a which is bored in gate-insulating layer 282 through a first interlayer insulating layer 283. On the other hand, the drain region 251D is connected to the connection wiring line 18 which is formed from the second metal layer via a contact hole 19b which is bored in the gate-insulating layer 282 through the first interlayer insulating layer 283, and the drain region is connected to the gate electrode 242 via a contact hole 19c which is bored in the first interlayer insulating layer 283 through the gate-insulating layer 282 from the connection wiring line 18. Further, the channel region 251a is provided on its upper layer with a gate electrode 252 with the gate-insulating layer 282 being sandwiched therebetween. The switching TFT 112 is formed according to the above configuration.

The silicon layer 241 is provided with a source region 241S, a channel region 241a, and a drain region 241D. Moreover, the source region 241S and the drain region 241D have a gradient of concentration, so-called a LDD structure. The source region 241S is connected to the power source wiring line 103a via a contact hole 19d which is bored in the gate-insulating layer 282 through the first interlayer insulating layer 283. On the other hand, the drain region 241D is connected to the connection wiring line 18 which is formed from the second metal layer via a contact hole 19e which is bored in the gate-insulating layer 282 through the first interlayer insulating layer 283, and the drain region is connected to the anode 23 via a contact hole 19f which is bored in the second interlayer insulating layer 284 through the inorganic bank layer 221a. Further, the channel region 241a is provided on its upper layer with the gate electrode 242 with the gate-insulating layer 282 being sandwiched therebetween. The driving TFT 123 is formed according to the above configuration.

The circuit part 11 is configured by the layers from the substrate 20 to the second interlayer insulating layer 284, which have been described above.

Moreover, in the circuit part 11, in order to form the signal lines 102 and the power source lines 103 of intersecting the scanning lines 101 or to form the TFTs, at least two metal layers arranged on the different layers and having insulation are required. Therefore, it is most of all essential to provide a second metal layer.

An example of a method of manufacturing the EL display device 1 according to the present exemplary embodiment is described below with reference to FIGS. 7(a)-7(d). Each sectional view shown in FIG. 7(a) to FIG. 7(d) corresponds to a sectional view taken along Plane E-F in FIGS. 5(a) and 5(b), and is shown in sequence of the respective manufacturing processes. Further, the following description is made mainly about a process particularly related to the present invention, that is, a process of forming the circuit part 11.

As shown in FIG. 7(a), first, the base protective layer 281 made of a silicon oxide film, etc. is formed on the substrate 20. Next, after forming an amorphous silicon layer by using an ICVD method, a plasma CVD method, etc., crystal grains are caused to grow up by a laser annealing method or a rapid heating method to form a poly silicon layer. Then, the poly silicon layer is patterned through a photolithographic method to form the island-shaped silicon layers 241, 251, 261. Further, the gate-insulating layer 282 made of a silicon oxide film is formed.

The formation of the gate-insulating layer 282 is carried out by forming a silicon oxide film with a thickness of approximately 30 nm to 200 nm, which covers each silicon layer 241, 251 (both of them are not shown), and 261 and the base protective layer 281, using the plasma CVD method, a heat oxidizing method, etc.

When the gate-insulating layer 282 formed by using the heat oxidizing method, the crystallization of the silicon layers 241, 251 is also carried out, so that it is possible to form the silicon layers as poly silicon layers. Further, impurity ions, such as boron ions, are implanted at this timing to perform a channel doping.

Next, an ion injection/selection mask is formed in a portion of the silicon layers 241, 251. In this state, impurity ions such as phosphorus ions are injected. As a result, high concentration impurities are introduced into the ion injection/selection mask in a self-alignment manner, and a high concentration source and drain regions are formed in the silicon layers 241, 251.

Next, after removing the ion injection/selection mask, a process of forming a first metal layer is performed. The first metal layer is formed on the gate-insulating layer 282 with a thickness of approximately 500 nm. Further, the metal layer is patterned to form the scanning lines 101, gate electrodes 242, 252, a condenser electrode 150, etc., simultaneously.

Moreover, the gate electrodes 242, 252 are used as masks, and impurity ions such as low concentration phosphorus ions are injected into the silicon layers 241, 251. As a result, low concentration impurities are introduced into the gate electrodes 242, 252 in self-alignment manner, and a low concentration source and drain regions are formed in the silicon layers 241, 251.

Figure 7:
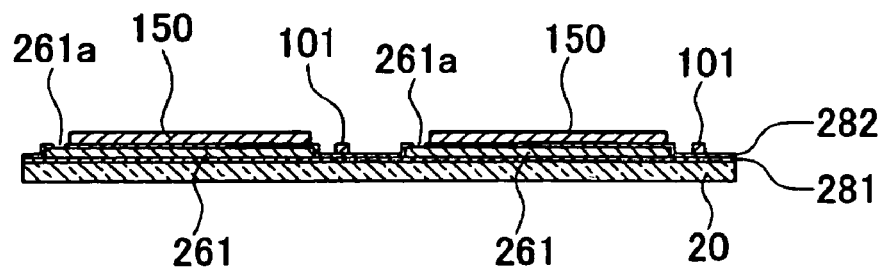
FIGS. 7(a)-7(d) are schematics explaining a manufacturing method according to a first exemplary embodiment of the present invention.
Figure 7:
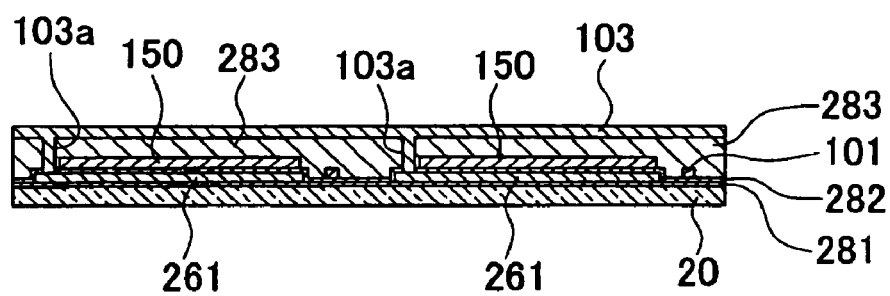
Figure 7:
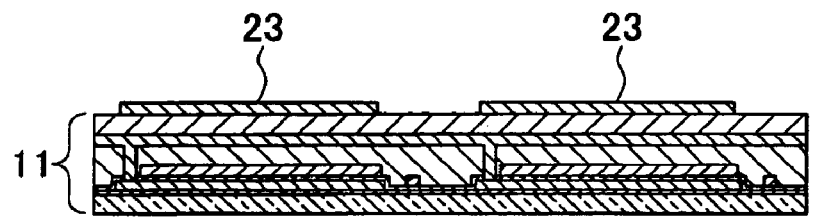
Figure 7:
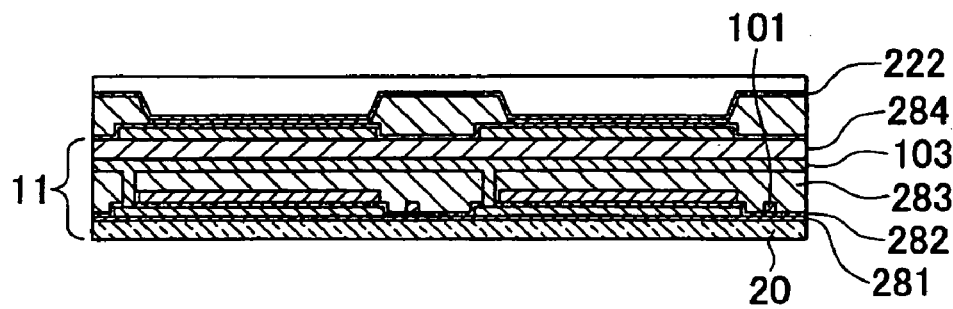

Next, as shown in FIG. 7(*b*), after removing the ion injection/selection mask, the second interlayer insulating layer 283 is formed on the entire surface of the substrate 20. Further, the second interlayer insulating layer 283 is patterned by the photolithographic method, the contact holes 103*a* are provided. At this time, though not shown in the drawing, the contact holes 19*a*, 19*b*, 19*c*, 19*d*, 19*e* are simultaneously formed.

Next, a process of forming a second metal layer is performed. First, the second metal layer with a thickness of approximately 200 nm to 80 nm made of metals, such as aluminum, chrome, and tantalum is formed in such a manner to cover the contact holes 103*a*, 19*a*, 19*b*, 19*c*, 19*d*, 19*e* with the metals of the second metal layer. Moreover, a patterning mask is formed on the second metal layer. Then, the second metal layer is patterned by the patterning mask, and power source lines 103, signal lines 102 and connection wiring lines 18 are formed.

Next, as shown in FIG. 7(*c*), the first interlayer insulating layer 284 covering the second interlayer insulating layer 283 is formed from an acryl-series resin material. It is preferable that the first interlayer insulating layer 284 is formed with a thickness of approximately 1 to 2 μm.

Next, in the first interlayer insulating layer 284, the contact holes 19*f* are formed by removing a part of the connection wiring lines 18 corresponding to the drain regions 241D of the driving TFTs 123 through an etching process. As a result, the circuit part 11 is formed on the substrate 20.

Moreover, in the above processes described above, although a manufacturing process on the dummy region 5 or on its circumference has not been described owing to description with reference to a sectional view of the substantial display region 4, for example, a proper process of forming the scanning-line driving circuits 80 and the inspection circuit 90 as well as forming cathode wiring lines to hold the contact with the cathode 50 passing through the circuit part 11 from the gate-insulating layer 282 is naturally performed.

A order of obtaining the display device 1 by forming the pixel part 3 in the circuit part 11 is simply described below with reference to FIG. 7(*c*) and FIG. 7(*d*).

First, as shown in FIG. 7(*c*), a thin film composed of a transparent electrode material, such as ITO, is formed in such a manner to cover the entire surface of the circuit part 11. Then, the thin film is patterned to bury holes provided on the first interlayer insulating layer 284 to form the contact holes 19*f*. Further, the anodes 23 and the dummy electrodes 23*a* are formed. The anodes 23 are formed only at portions where the driving TFTs 123 are formed, and the anodes are connected to the driving TFTs 123 via the contact holes 19*f*. The dummy electrodes 23*a* are arranged in an island shape.

Next, as shown in FIG. 7(*d*), the inorganic bank layers 221*a* are formed on the first interlayer insulating layer 284, the anodes 23, and the dummy electrodes 23*a*. The inorganic bank layers 221*a* are formed such that a portion of the anodes 23 opens on the anodes 23, and the dummy electrodes 23*a* are fully covered on the dummy electrodes 23*a*.

For instance, after forming inorganic films such as $SiO_2$, $TiO_2$, and SiN on the entire surface of the first interlayer insulating layer 284 and the anodes 23 by the CVD method, TEOS method, sputtering method, deposition method, etc., the inorganic bank layers 221*a* are formed by patterning the inorganic films.

Moreover, the organic bank layers 221*b* are formed on the inorganic bank layers 221*a*. The organic bank layers 221*b* are formed such that the pixel display parts 26 open with a predetermined size on all the anodes 23 and the dummy electrodes 23*a*. The inorganic bank layer 221*a* and the organic bank layer 221*b* form the bank 221.

Subsequently, on the surface of the bank 221, a region showing a lyophilic property and a region showing a lyophobic property are formed. In the present exemplary embodiment, the respective regions are formed by a plasma treatment process. More specifically, the plasma treatment process comprises at least a lyophilic process of making the anode 23 and the inorganic bank layer 221*a* have a lyophilic property, and a lyophobic process of making the organic bank layer 221*b* have a lyophilic property.

That is, the banks 112 are heated up to a predetermined degree of temperature (for instance, approximately 70 to 80° C.). Next, as for the lyophilic process, a plasma treatment ($O_2$ plasma treatment) using oxygen as a reaction gas in the atmosphere is performed. Then, as for the lyophobic process, a plasma treatment using 4-fluoro methane as a reaction gas ($CF_4$ plasma treatment) in the atmosphere is performed. By cooling the banks 112 heated for the plasma treatments down to room temperature, lyophilic and lyophobic properties are given to predetermined parts.

Next, the functional layers 110 are formed on the anodes 23, and the inorganic bank layers 221*a* on the dummy electrodes 23*a*, respectively, by an ink-jet method. After discharging and drying composition ink including hole injection/transport layer materials constituting the hole injection/transport layers 70, the functional layers 110 are formed by discharging and drying the composition ink including light-emitting layer materials constituting the organic EL layers 60. Moreover, after forming the functional layers 110, it is preferable to perform the above process in the inert gas atmosphere, such as nitrogen and argon atmosphere, in order to prevent the hole injection/transport layers 70 and the organic EL layers 60 from being oxidized.

Next, the cathode 50 for covering the banks 112 and the functional layers 110 are formed. For this purpose, after forming the buffer layer 222 and a first cathode layer, the first cathode layer is covered to form a second cathode layer to be connected to a cathode wiring line (not shown) on the substrate 20.

Finally, sealing resin 40 such as epoxy resin to the substrate 20 is applied to bond the sealing substrate 30 to the substrate 20 via the sealing resin 40. By doing this, the EL display device 1 according to the first exemplary embodiment of the present invention is obtained.

An operation of the EL display device 1 according to the present exemplary embodiment is described below.

According to the EL display device 1 related to the present exemplary embodiment, since the power source lines 103 formed from the second metal layer are located below the anodes 23 at the positions overlapping the pixel display parts 26, the light emitted downwardly from the organic EL layers 60 and transmitted through the transparent anodes 23 can be reflected upwardly by the power source lines 103, and the emitted light can be efficiently emitted to the cathode 50.

Moreover, such reflecting surface uses the second metal layer necessary to form the circuit part 11 and is also used as the power source lines 103. Thus, it is unnecessary to provide a reflecting film as a base layer to the transparent electrode, though the transparent electrode having excellent electrode properties are used. As a result, since it is possible to save materials and processes, thereby supplying at a low price by reducing or suppressing the manufacturing cost.

Further, in the present exemplary embodiment, since switching elements, such as a switching TFT 112 and a driving TFT 123 having a three-dimensional laminated structure, are formed between the pixel display parts 26, the power source lines 103 disposed under the pixel display parts 26 can be formed by overlapping a flat beta-shaped pattern from the substrate 20. Accordingly, it is possible to form a reflecting surface having excellent flatness. As a result, the use efficiency of light can be improved without reflection nonuniformity and the display quality can be enhanced.

Moreover, since a storage capacitor 113 is provided in any layer under power source lines 103 by using the flat beta-shaped pattern, the storage capacitor 113 can be formed in a lower region of the wide pixel display part 26, and the space can be efficiently used to magnify the storage capacitor 113. As a result, the holding property of display can be improved and excellent display can be stably performed.

Further, according to the present exemplary embodiment, since a thick power source line 103 can be configured, the electric resistance can be lowered and the energy-economizing type device can be obtained.

Further, in the present exemplary embodiment, since a reflecting surface is configured by a second metal layer located nearer to the anodes 23 and located relatively higher than the circuit part 11, a transmitting optical path of the reflected light can be relatively shortened, the optical loss can be reduced, and the height of a space under the reflecting surface can be relatively elevated.

A modified example of the present exemplary embodiment is described below as follows.

Figure 8:
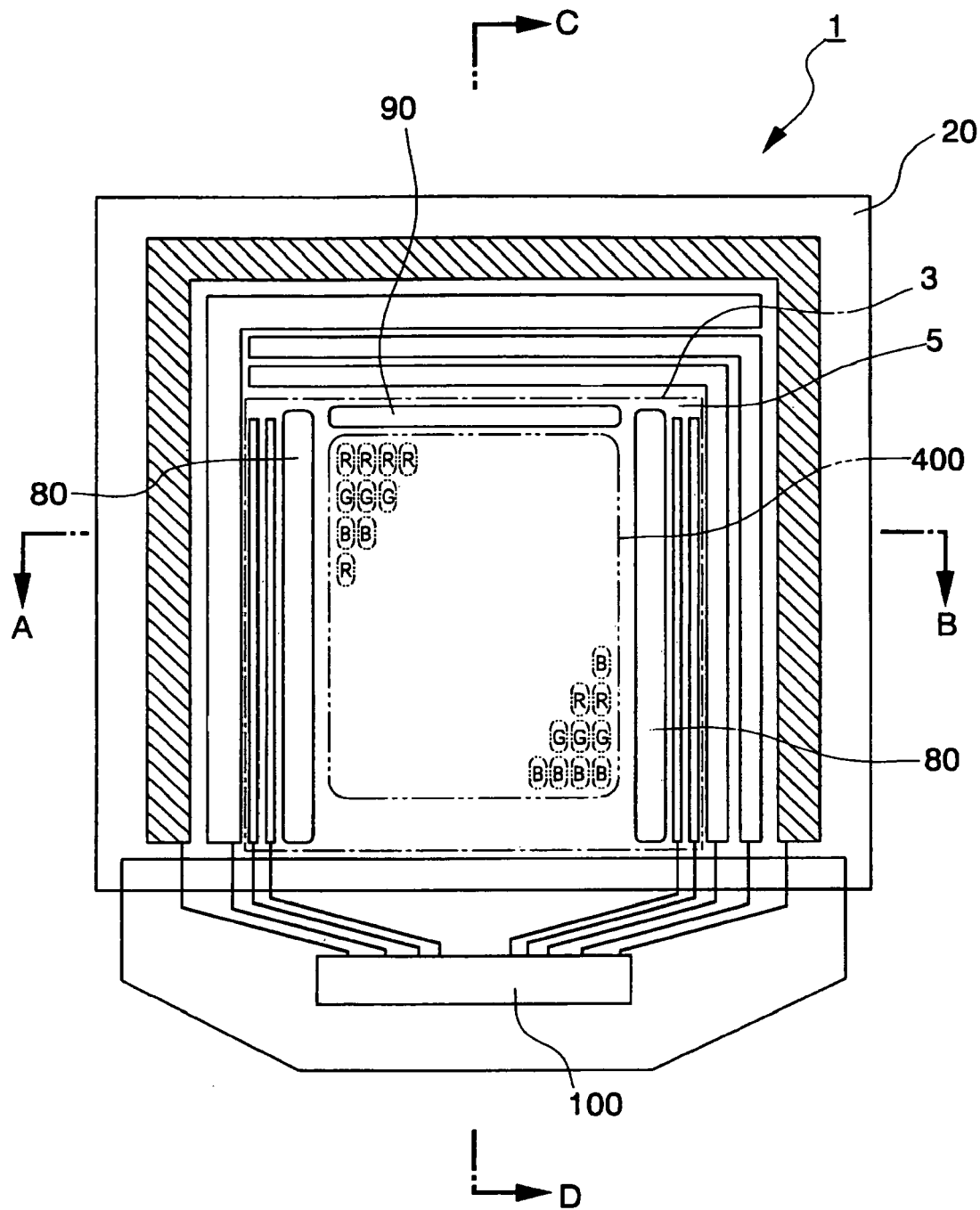
FIG. 8 is a plan view illustrating a configuration of an EL display device as a modified example according to a first exemplary embodiment of the present invention.

FIG. 8 is a plan view illustrating a configuration of the EL display device 1 according to the present modified example. The EL display device shown in FIG. 8 is different from the device shown in FIG. 2 only in that the substantial display region 4 is substituted with a substantial display region 400. Hereinafter, members similar to those in the first embodiment are given similar reference numerals, and the description thereof is omitted. The present modified example is described below mainly about different parts.

The modified example is different from the first exemplary embodiment in that the display regions (R, G, B) are respectively arranged to continue vertically in the substantial display region 4 (see FIG. 2), whereas they are configured to continue horizontally in the substantial display region 400. For this reason, four consecutive pixel regions A are configured as shown in FIGS. 9(a) and 9(b).

Figure 9:
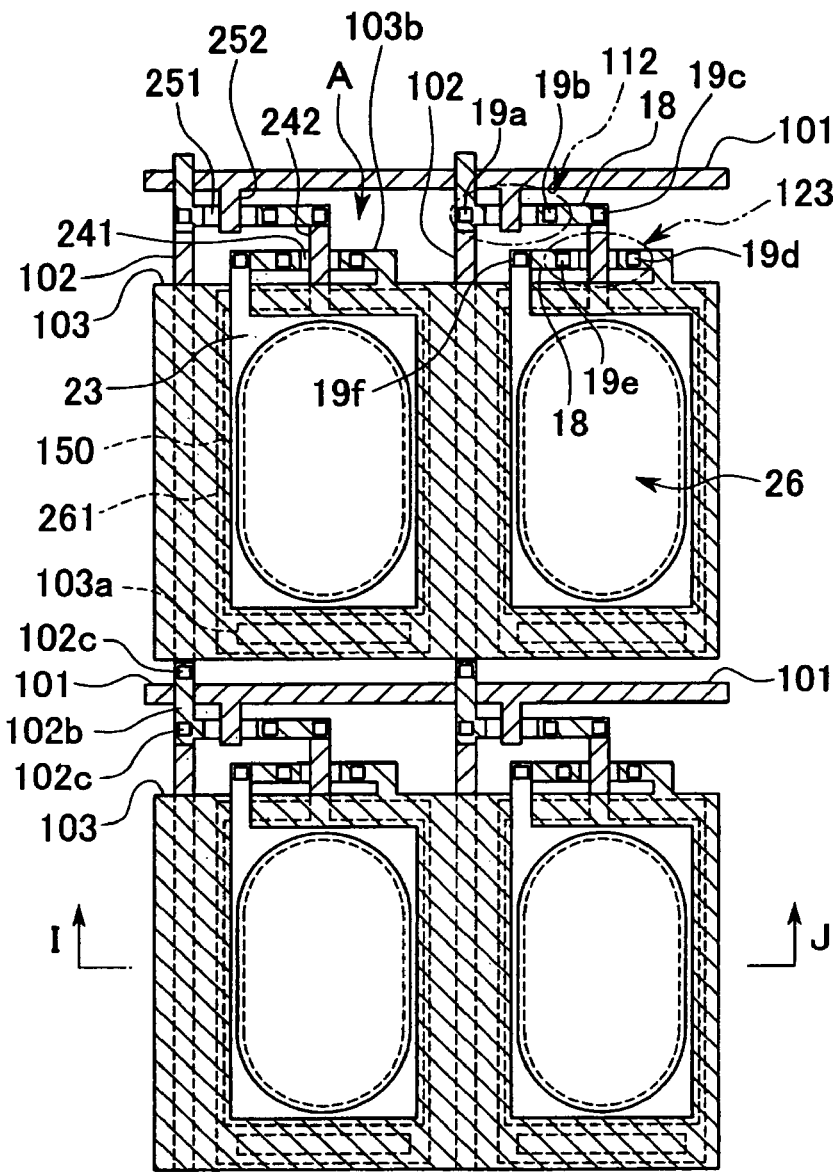
FIGS. 9(a) and 9(b) are a schematic and sectional view as viewed from a plane of four adjacent pixel regions A in a substantial display region as a modified example according to a first exemplary embodiment of the present invention.
Figure 9:
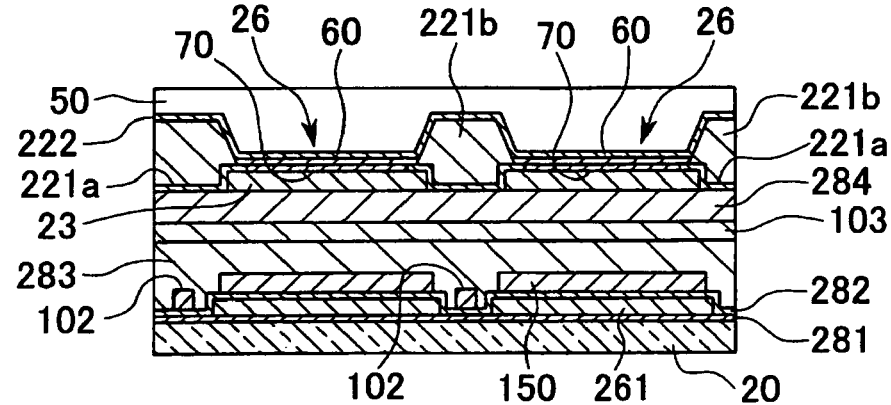

FIG. 9(a) is a schematic as viewed from a plane of four adjacent pixel regions A on the substantial display region 400. FIG. 9(b) is a sectional view taken along Plane I-J of FIG. 9(a).

FIGS. 9(a) and 9(b) is greatly different from FIGS. 5(a) and 5(b) in that power source lines 103 are provided substantially parallel to the signal lines 102 in FIGS. 5(a) and 5(b), whereas power source lines 103 intersect the signal lines 102 and extend substantially parallel to scanning lines 101 in FIGS. 9(a) and 9(b). Since an organic EL layer 60 is different for every color and driving voltages are also different for each display region (R, G, B), the power source lines 103 extend in the direction of the display regions having the same color. The power source lines 103 are formed on a second metal layer. The others have the substantially same layer structure. However, in the present modified example, since it is necessary to make the signal lines 102 intersect the power source lines 103, the signal lines 102 are formed from a first metal layer at a position of intersecting the power source lines 103. Further, a connection wiring 102b is formed from the second metal layer at a position where the signal lines 102 intersect the scanning lines 101 formed from the first metal layer. For this reason, it is configured that contact holes 102c, 102c bored in a first interlayer insulating layer 283 are provided around the scanning lines 101, and are connected with the signal lines 102, respectively, thereby detouring the scanning lines 101 of the same layer as the signal lines 102. Such configuration can be easily obtained by changing a patterning when etching the first metal layer and the second metal layer.

Further, the switching TFTs 112 and the driving TFTs 123 are disposed between the scanning lines 101 and the power source lines 103. On the other hand, the silicon layers 261 and the condenser electrodes 150 are laminated in a beta-shaped pattern below the pixel display part 26 and the power source lines 103. The power source lines 103 and the silicon layer 261 have the same potential by the contact holes 103a. A configuration of a storage capacitor 113 is the same as that of FIGS. 5(a) and 5(b).

According to the present modified example, since the power source lines 103 does not intersect the scanning lines 101, though they have the same effects as the above, electrostatic capacitor formed between the power source lines 103 gets smaller, thereby quickly performing a switching operation.

Further, since switching elements are provided between the scanning lines 101 and the power source lines 103, a more compact insertion is enabled by locating the switching TFT 112 and the driving TFT 123 in parallel to the lateral direction of the pixel display part 26. As shown in FIG. 5(a), the TFTs 112, 123 are arranged to a long direction of the pixel display part 26, thereby reducing a space. On the other hand, an opening ratio can be remarkably enhanced by making the pitch in the lateral direction of the pixel display part 26 narrow.

By enhancing the opening ratio, a luminous amount around a unit surface area of an organic EL layer 60 can be reduced, enhancing element life span.

Further, in the above description, an example of disposing the power source lines 103 as planes of reflection has been described in order to overlap with a total area of the pixel display part 26 as the most preferable example. However, if the luminous amount has in reserve even though a reflective amount is reduced, the power source lines 103 do not necessarily have to cover the total area of the pixel display part 26, needless to say.

Similarly, if the luminous amount has in reserve, reflection nonuniformity can be permitted to some extent. Thus, there is no difficulty even though a lower part of the power source lines 103 has deteriorated flatness without a flat beta-shaped pattern. For instance, it is possible to provide circuit elements except the storage capacitor 113 in the lower part of the power source lines 103. Then, a space under the power source lines 103 can be more efficiently used.

Second Exemplary Embodiment

An EL display device 1 as a second exemplary embodiment of an electro-optical device of the present invention is described below. Similar to the first exemplary embodiment, a reflecting surface is provided on a second metal layer according to the second exemplary embodiment. However, it is different from the first exemplary embodiment because the power source lines 103 are configured on a first metal layer. Besides, the second exemplary embodiment has the same configuration as that of the first exemplary embodiment.

Hereinafter, descriptions about the same parts are omitted by attaching the same reference numerals.

The EL display device 1 of the present exemplary embodiment is a device of type as shown in FIG. 8. Because of this, similar to the modified example of the first exemplary embodiment, the power source lines 103 are substantially parallel to the scanning lines 101 and are provided in the direction of intersecting the signal lines 102.

Referring to FIGS. 10(a) and 10(b), a substantial display region 400 according to the present exemplary embodiment is described in detail. FIG. 10(a) is a schematic as viewed from a plane of four adjacent pixel regions A in the substantial display region 400 of the EL display device 1 according to the present exemplary embodiment. FIG. 10(b) is a sectional view taken along Plane K-L in FIG. 10(a).

Each power source line 103 has a width to cover the total area of a pixel display part 26 by using a first metal layer, on a gate-insulating layer 282, and is consecutively provided substantially parallel to the scanning line 101 formed from the same first metal layer. A first interlayer insulating layer 283 is provided thereupon. A reflective part (metal part, 151), signal lines 102, and a connection wiring line 18 are formed thereupon, as covering each area of the pixel display part 26 by a second metal layer. Anodes 23 are provided on the reflective part 151. As viewed from the plane, a switching TFT 112 and a driving TFT 123 are formed between the scanning lines 101 and the power source lines 103.

A storage capacitor 113 is formed in a lower part of the reflective part 151 by a silicon layer 261 and the power source lines 103 with a gate-insulating layer 282 being sandwiched therebetween.

A configuration of the switching TFT 112 and the driving TFT 123 is described below with reference to FIGS. 11(a) and 11(b). FIG. 11(a) is an enlarged schematic around the switching TFT 112 and the driving TFT 123 of FIG. 10(a). FIG. 11(b) is a sectional view taken along Plane M-N of FIG. 11(a).

The switching TFT 112 has a source region 251S, a channel region 251a, and a drain region 251D. The source region 251S is connected to a source electrode wiring line 102a extending from the signal line 102 by a contact hole 19a. On the channel region 251a, a gate-insulating layer 282 and a gate electrode 252 extended to form a portion of scanning line 101 are provided. Further, the drain region 251D is connected to a gate electrode 242 provided by a first metal layer. By the above configuration, the switching TFT 112 is formed.

Next, the driving TFT 123 has a source region 241S, a channel region 241a, and a drain region 241D. The source region 241S is connected to a contact hole 19i, which is bored from a gate-insulating layer 282 to a first interlayer insulating layer 283. The contact hole 19i is connected to a connection wiring line 18. The connection wiring line 18 is connected to the power source line 103 by a contact hole 19j which is bored from the first interlayer insulating layer 283 to the gate-insulating layer 282. On the channel region 241a, the gate-insulating layer 282 and a gate electrode 242 are provided. The gate electrode 242 is connected to a silicon layer 261. Further, the drain region 241D is connected to a reflective part wiring line 151a extending from a reflective part 151 by a contact hole 19h, which is bored in the first interlayer insulating layer 283 from the gate-insulating layer 282. By the above configuration, the driving TFT 123 is formed. Since anodes 23 are provided on the reflective part 151, the drain region 241D is electrically connected to the anode 23.

An example of a method of manufacturing an EL display device 1 according to the present exemplary embodiment is simply described below with reference to FIGS. 12(a)-12(d).

Figure 10:
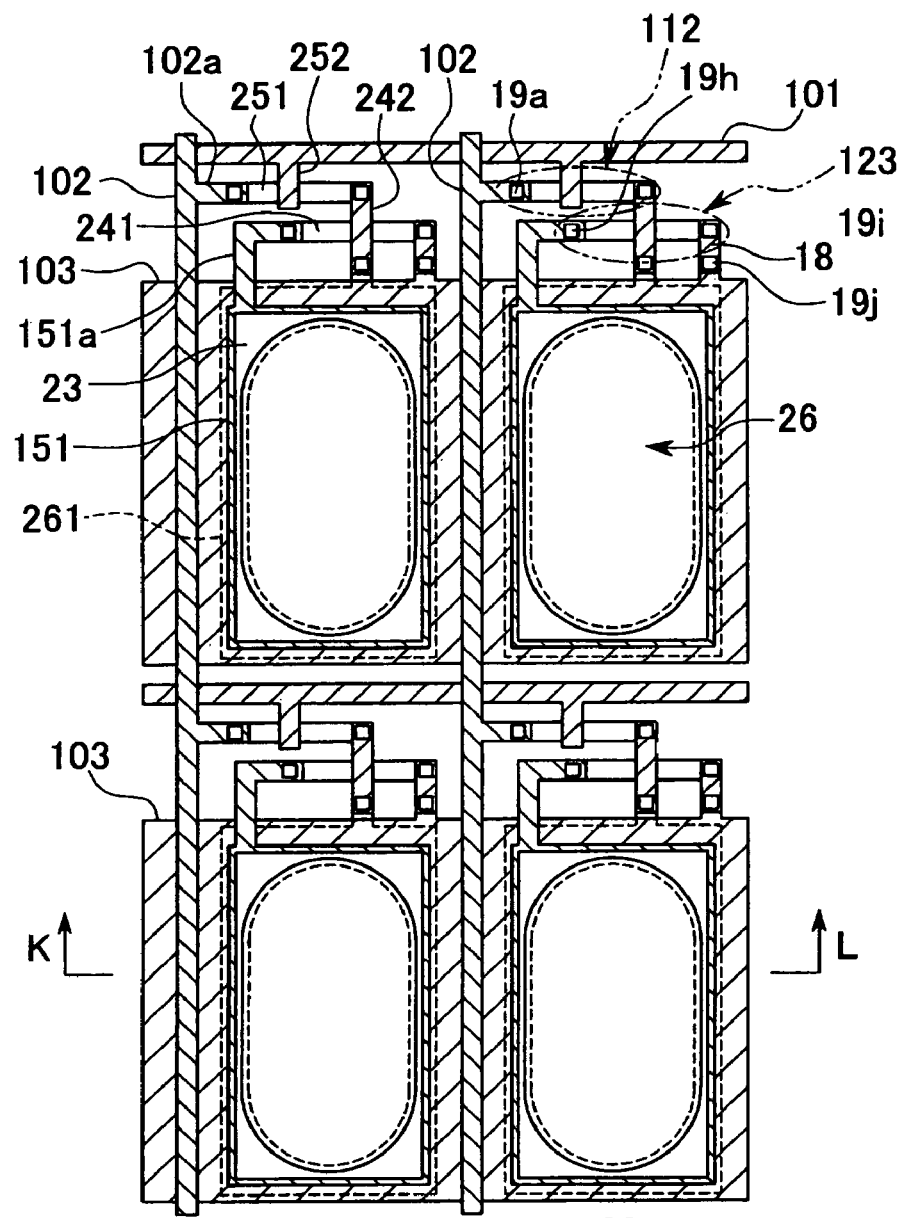
FIGS. 10(a) and 10(b) are a schematic and sectional view as viewed from a plane of four adjacent pixel regions A in a substantial display region according to a second exemplary embodiment of the present invention.
Figure 10:
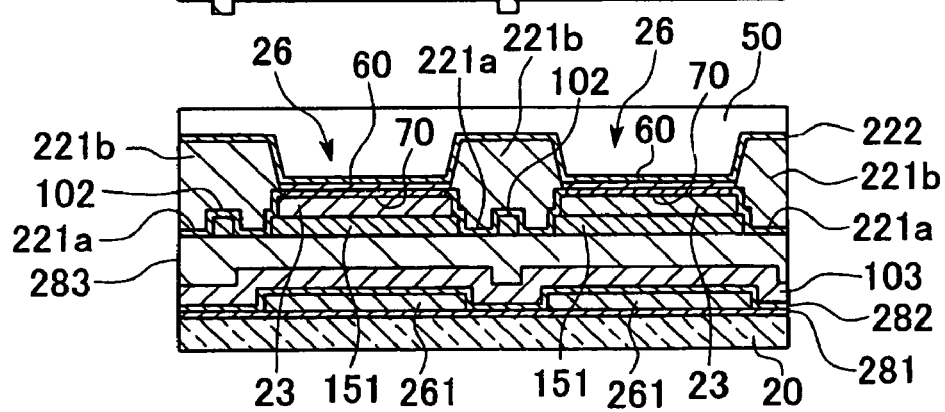
Figure 11:
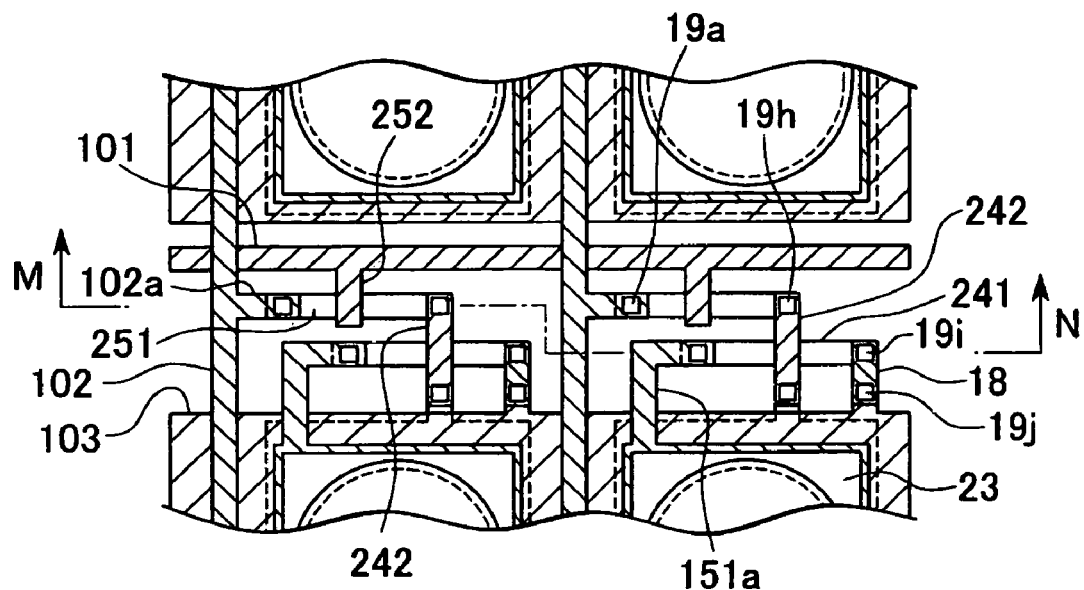
FIGS. 11(a) and 11(b) are a partially enlarged schematic and sectional view as viewed from a plane of FIGS. 10(a) and 10(b)
Figure 11:
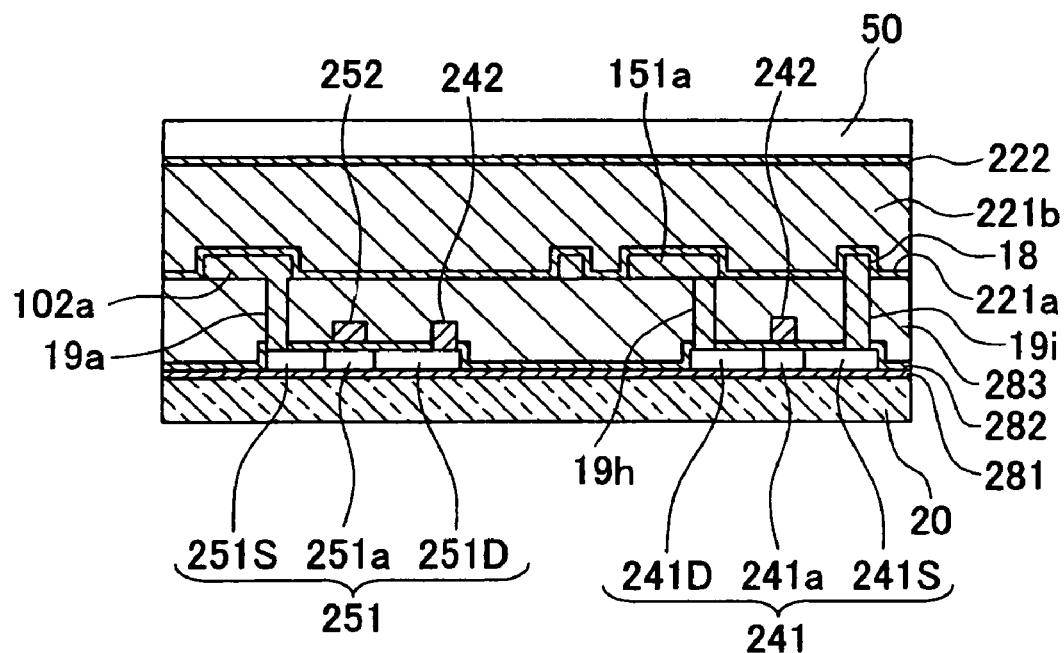

Each sectional view shown in FIG. 12(a) to FIG. 12(d) corresponds to the sectional view taken along Plane K-L of FIG. 10, and shows each manufacturing process. Further, a process particularly related to the present invention, that is, a process of forming a circuit part 11 is described, and the description about parts common to the first exemplary embodiment is omitted.

Figure 12:
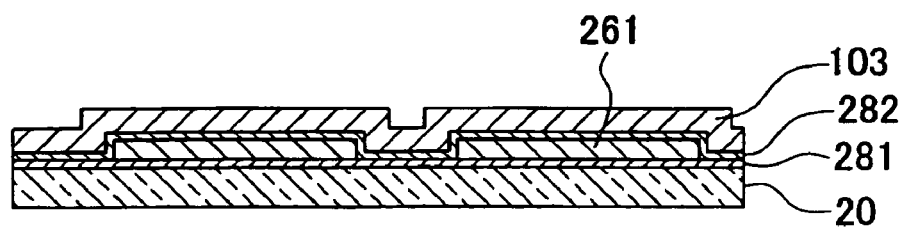
FIGS. 12(a)-12(d) are schematics explaining a manufacturing method according to a second exemplary embodiment of the present invention.
Figure 12:
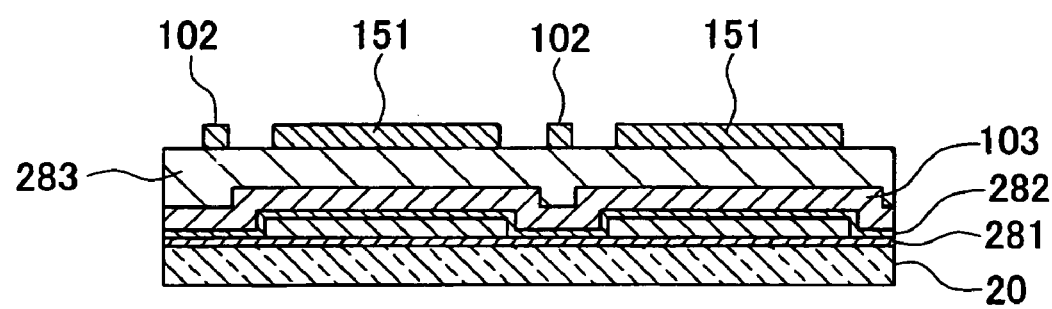
Figure 12:
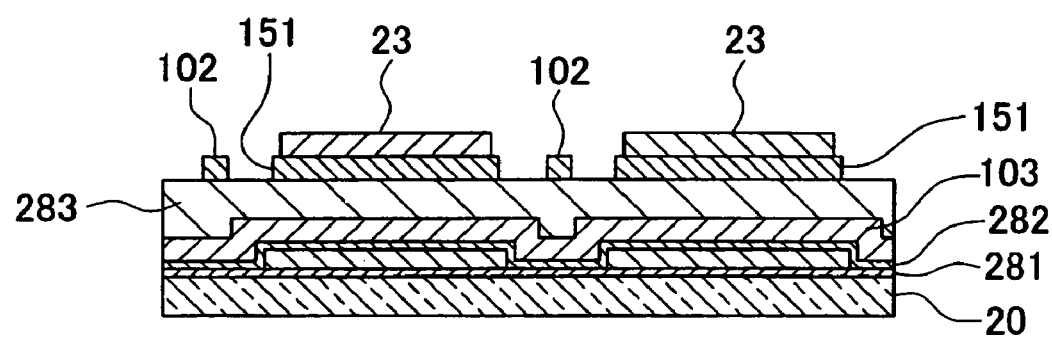
Figure 12:
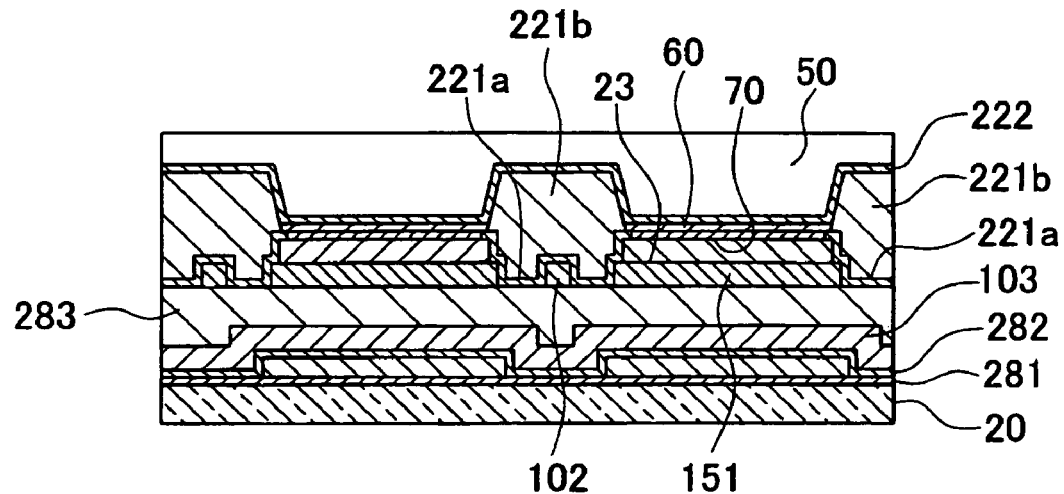

As shown in FIG. 12(a), first, a base protective layer 281 is formed on a substrate 20. Next, silicon layers 241, 251, 261 are formed. Further, a gate-insulating layer 282 is formed. A method of forming a source region and a drain region having the gradient of concentration on the silicon layers 241, 251, respectively, is performed similar to the first exemplary embodiment.

Next, a first metal layer with a thickness of approximately 500 nm is formed on the gate-insulating layer 282. The metal layer is patterned to form scanning lines 101, gate electrodes 242, 252, and power source lines 103 simultaneously (a first metal layer formation process).

Next, as shown in FIG. 12(b), a second interlayer insulating layer 283 is formed on an entire surface of a substrate 20, and the second interlayer insulating layer 293 is patterned to form contact holes 19a, 19h, 19i, 19j (not shown).

Then, a second metal layer is formed in such a manner to cover the second interlayer insulating layer 283, thereby filling the previously formed contact holes 19a, 19h, 19i, 19j with metals of the second metal layer. Moreover, a patterning mask is formed on the second metal layer. The second metal layer is patterned by the patterning mask. As a result, and reflective parts 151, signal lines 102, and connection wiring lines 18 are formed (a second metal layer formation process).

Next, as shown in FIG. 12(c), anodes 23 are formed on the reflective parts 151. So, a circuit part 11 is formed on a substrate 20.

Further, in the above process so far, though a manufacturing process on a dummy region 5 or on its circumference has not been described owing to description with reference to a sectional view of a substantial display region 400, a proper process of forming scanning-line driving circuits 80 and an inspection circuit 90 as well as forming a cathode wiring line contacted with cathode 50 passing through the circuit part 11 from a gate-insulating layer 282 is naturally performed.

A process of forming a hole injection/transport layer 70, an organic EL layer 60, and the cathode 50 on the circuit part 11 as well as a process of bonding a sealing substrate 30 to the substrate 20 is the same as the first exemplary embodiment, thereby omitting duplicate description.

Thus, the EL display device 1 according to the second exemplary embodiment of the present invention is obtained.

An operation of the EL display device 1 according to the present exemplary embodiment is described as follows.

According to the EL display device 1 related to the present exemplary embodiment, since a reflective part 151 formed on a second metal layer is arranged under an anode 23 at a position overlapping a pixel display part 26, the light emitted downwardly from an organic EL layer 60 and transmitted through the transparent anode 230 can be reflected upwardly by the reflective part 151, and the emitted light can be efficiently emitted to cathode 50.

Furthermore, such a reflective part 151 uses a second metal layer essential to form a circuit part 11. For this reason, it is unnecessary to separately provide a reflective film as a base layer to a transparent electrode, although the transparent electrode having excellent electrode properties is used, and to reduce materials and processes, thereby forming at a low price by reducing or suppressing the manufacturing cost.

Further, unlike a common process or the first exemplary embodiment, since a second interlayer insulating layer 284 for insulating the second metal layer from the anode 23 may not be provided, the manufacturing cost can be suppressed and the manufacturing cost can be simplified.

Further, in the present exemplary embodiment, since switching elements, such as a switching TFT 112 and a driving TFT 123 having a three-dimensional laminated structure, are formed between pixel display parts 26, the reflective part 151 disposed under the pixel display part 26 can be formed by overlapping a flat beta-shaped pattern from the substrate 20. Accordingly, a reflecting surface having excellent flatness can be formed. As a result, the use efficiency of light can be enhanced without reflection nonuniformity and the display quality can be enhanced.

Moreover, since a storage capacitor 113 is provided in any layer under power source lines 103 by using the flat beta-shaped pattern, the storage capacitor 113 can be formed in a lower region of the wide pixel display part 26, and the space can be efficiently used to magnify the storage capacitor 113. As a result, the holding property of display can be enhanced and excellent display can be stably performed.

Further, according to the present exemplary embodiment, since a thick power source line 103 can be configured, the electric resistance can be lowered and the energy-economizing type device can be obtained.

Further, in the present exemplary embodiment, since a reflecting surface is configured by a second metal layer located nearer to the anodes 23 and located relatively higher than the circuit part 11, a transmitting optical path of the reflected light can be relatively shortened, the optical loss can be reduced, and the height of a space under the reflecting surface can be relatively elevated.

Further, according to the present exemplary embodiment, since the power source lines 103 do not intersect the scanning lines 101, the electrostatic capacitor formed between the power source lines 103 gets smaller and a switching operation is quickly performed.

Further, since switching elements are provided between the scanning lines 101 and the power source lines 103, a more compact insertion can be made by making a switching TFT 112 and a driving TFT 123 parallel to the lateral direction of the pixel display part 26. On the other hand, the pitch in the lateral direction of the pixel display part 26 can be made narrow. Further, the reflective part 151 does not have to continue to a metal part located under the pixel display part 26 including the power source lines 103. Thus, it is not necessary to provide contact holes for continuity. As a result, there are no restrictions on an area of the pixel display part 26 by the contact holes. Accordingly, an opening ratio can be remarkably enhanced.

By enhancing the opening ratio, a luminous amount around a unit surface area of an organic EL layer 60 may be smaller, thereby enhancing an element life span.

A modified example of the present exemplary embodiment is described as follows.

Figure 13:
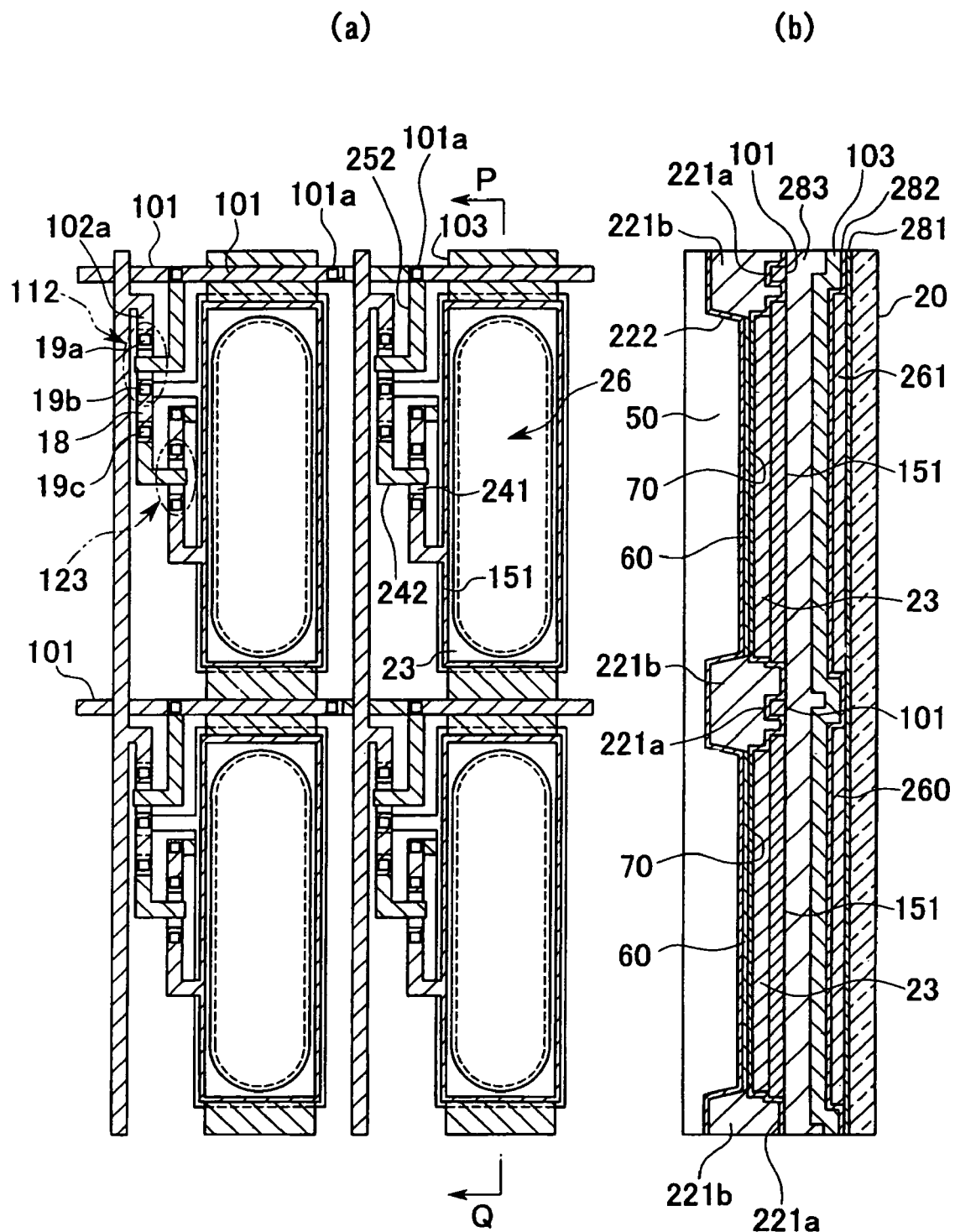
FIGS. 13(a) and 13(b) are a schematic and sectional view as viewed from a plane of four adjacent pixel regions A in a substantial display region according to a modified example of a second exemplary embodiment of the present invention.

FIGS. 13(*a*) and 13(*b*) are enlarged schematics illustrating a configuration of a substantial display region of an EL display device 1 according to the present modified example. The present modified example is a device of type as shown in FIG. 2, and it is different from the abovementioned exemplary embodiments only in that the substantial display region 4 is substituted with a substantial display region 400. Hereinafter, members similar to those in the above exemplary embodiments are given similar reference numerals, the description thereof is omitted, and the present modified example is described mainly about different parts.

The display regions (R, G, B) are respectively arranged to continue vertically in the substantial display region 4, whereas they are configured to continue horizontally in the substantial display region 400 (see FIG. 8). For this reason, four consecutive pixel regions A are configured as shown in FIGS. 13(*a*) and 13(*b*).

FIG. 13(*a*) is a schematic as viewed from a plane of four adjacent pixel regions A on the substantial display region 400. FIG. 13(*b*) is a sectional view taken along Plane P-Q in FIG. 13(*a*).

FIGS. 13(*a*) and 13(*b*) are greatly different from FIGS. 10(*a*) and 10(*b*) in that the power source lines 103 are provided substantially parallel to the scanning lines 101 in FIGS. 10(*a*) and 10(*b*), whereas power source lines 103 intersect scanning lines 101 and extend substantially parallel to signal lines 102 in FIGS. 13(*a*) and 13(*b*). They are similar to each other in that the power source lines 103 are formed on a first metal layer, and a reflective part 151 is formed on a second metal layer. The others have substantially the same layer structure. However, in the present modified example, since the signal lines 102 intersect the scanning lines 101, the scanning lines 102 are formed from a first metal layer at a position of intersecting the signal lines 102. For this reason, it is configured that contact holes 101*a*, 101*a* bored in a first interlayer insulating layer 283 are provided around the signal lines 102 and are connected to the scanning lines 101, respectively, thereby detouring the signal lines 102 of the same layer as the scanning lines 101. Such configuration can be easily obtained by changing a patterning when etching the first metal layer and the second metal layer.

Further, in the present modified example, unlike the first exemplary embodiment, it is possible to have a large area of the pixel display part 26 enough not to provide the contact hole 103*a*. Thus, a relatively large opening ratio can be obtained.

Further, although there has been described an example in which an insulating layer is not provided between the second metal layer and the anode 23, it is possible to provide the anode 23 and directly connect the anode 23 to the driving TFT 123 after providing a transparent insulating layer on the reflective part 151, instead of connecting the reflective part 151 to the driving TFT 123.

Furthermore, in both of the first and the second exemplary embodiments, a configuration is described above such that light is reflected by a reflecting surface formed from the second metal layer. However, it is possible to form the reflecting surface on the first metal layer. Since the reflecting surface can be configured without increasing the number of manufacturing processes even in such configuration, the manufacturing cost can be reduced or suppressed.

Furthermore, the first and the second exemplary embodiments are described above by way of an example in which, since an ink-jet method is used to form an organic EL layer 60, etc., the banks 221 have a two-layered structure including an inorganic bank layer 221*a* and an organic bank layer 221*b* so that lyophilic and lyophobic property can be easily given the banks 221. However, the banks may be a single-layered structure. In particular, when manufactured by a deposition method instead of using the ink-jet method, it is less expensive to manufacture the banks 221 having a single-layered structure.

Furthermore, although the first and the second exemplary embodiments are described above by way of an example in which two transistors form a switching element, a circuit using four or more transistors may be configured.

Third Exemplary Embodiment

Hereinafter, a specific example of an electronic apparatus including the EL display device according to the first or the second exemplary embodiment is described below with reference to FIGS. 14(a) and 14(c).

Figure 14:
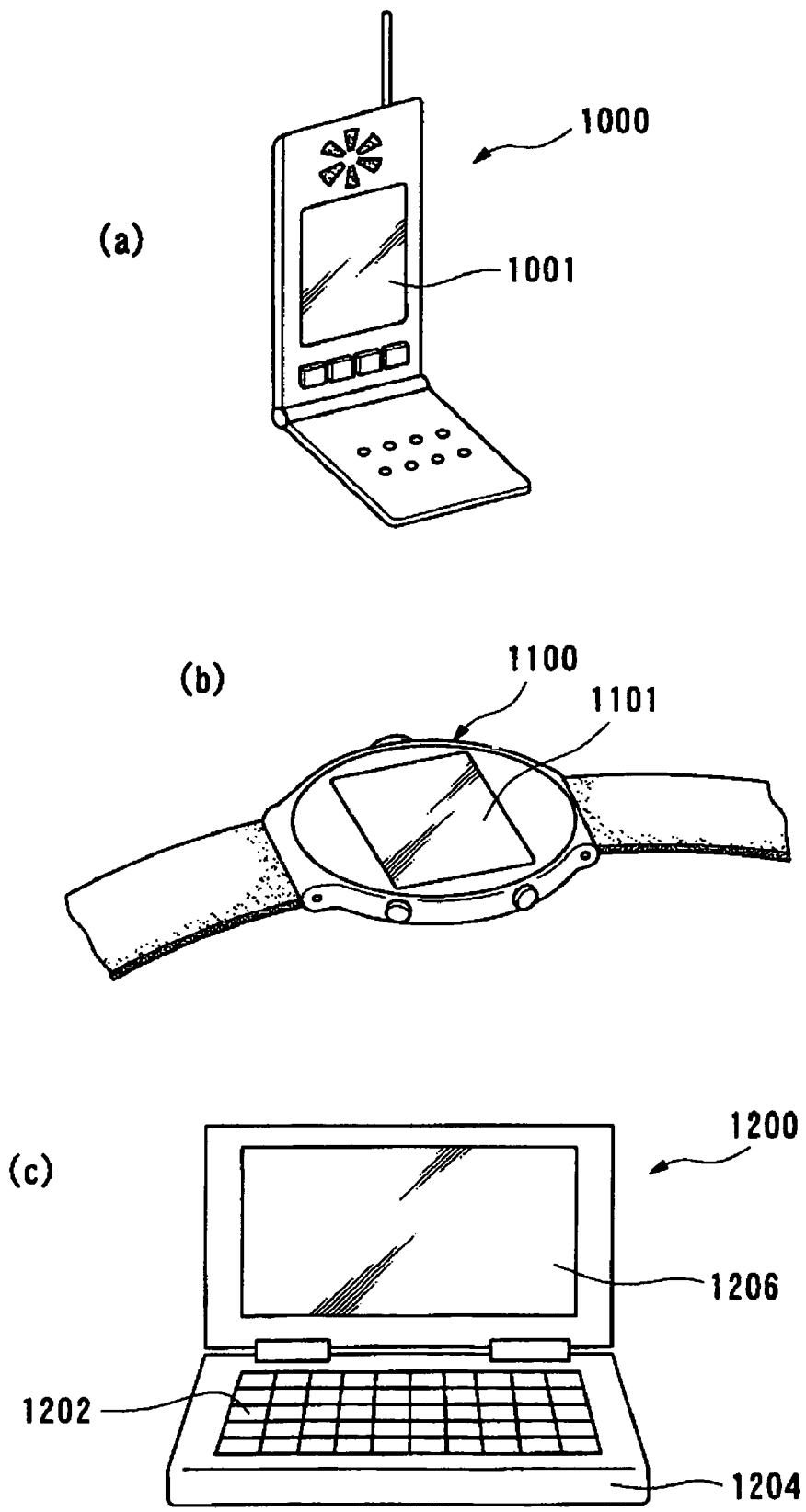
FIGS. 14(a)-14(c) are perspective views illustrating an electronic apparatus according to a third exemplary embodiment of the present invention.

FIG. 14(a) is a perspective view illustrating an example of a mobile phone. In FIG. 14(a), reference numeral 1000 denotes a mobile phone main body, and reference numeral 1001 denotes a display part using the aforementioned EL display device.

FIG. 14(b) is a perspective view illustrating an example of a wristwatch-type electronic apparatus. In FIG. 14(b), reference numeral 1100 denotes a watch main body, and reference numeral 1101 denotes a display part using the aforementioned EL display device.

FIG. 14(c) is a perspective view illustrating an example of a portable information-processing device, such as a word processor and a personal computer, for example. In FIG. 14(c), reference numeral 1200 denotes an information-processing device, reference numeral 1201 denotes an input unit, such as a keyboard, reference numeral 1202 denotes a display part using the aforementioned EL display device, and reference numeral 1203 denotes an information-processing device main body.

The respective electronic apparatus shown in FIG. 14(a) to FIG. 14(c) include a display part using an EL display device of the first, the second or the third exemplary embodiment, and has the characteristics of an EL display device of the first or the second exemplary embodiment. Therefore, electronic apparatuses whose display property and reliability are enhanced, and whose manufacturing cost is reduced, are obtained.

The electronic apparatuses are manufactured by assembling the EL display device 1 of the first or the second exemplary embodiment into the display parts of various electronic apparatuses, such as mobile phones, portable information-processing devices, and wristwatch-type electronic apparatuses, for example.

[Exemplary Advantages]

As described above, according to the electro-optical device of the present invention, a circuit layer includes metal parts, so that it is possible to reflect the light transmitted through a first electrode, to a second electrode. As a result, it is possible to emit the light from a light-emitting layer to the second electrode without giving reflexibility to the first electrode, and to enhance the use efficiency of light while reducing or suppressing the manufacturing cost. Accordingly, display performance can be enhanced at low cost.

Further, according to the electro-optical device of the present invention, since it is unnecessary to transmit the light through a lower part of the metal part, it is possible to efficiently use the space thereof. For instance, the display performance can be enhanced by configuring a large capacity of storage capacitor.

Moreover, according to a method of manufacturing an electro-optical device according to the present invention, since a metal part to reflect light is formed from a metal part necessary to form a circuit layer, it is possible to manufacture an electro-optical device having the metal part to reflect light without increasing the number of manufacturing processes.

Furthermore, according to an electronic apparatus of the present invention, since it includes an electro-optical device according to the present invention, an electronic apparatus having the same effect as the electro-optical device according to the present invention can be obtained.

What is claimed is:

1. An electro-optical device, comprising:
   a substrate;
   a functional layer having a light-emitting layer disposed in a pixel display part;
   a first electrode disposed above the substrate, the first electrode being an anode;
   a second electrode disposed so that the light emitting layer is disposed between the first electrode and the second electrode, the second electrode being a cathode;
   a driving transistor that controls a current to the first electrode; and
   a power source line configured to supply the current to the first electrode, the power source line being electrically connected to the driving transistor and being disposed under the first and second electrodes, the power source line extending along a first direction, and the power source line having a first edge extending along the first direction and a second edge opposing the first edge, the first edge and the second edge overlapping the first electrode such that the power source line substantially overlaps an entire portion of the first electrode.

2. The electro-optical device of claim 1, further comprising:
   an insulating film having an opening portion that corresponds to the pixel display part, the opening portion and the power source line overlap.

3. The electro-optical device of claim 1, further comprising:
   a capacitative element connected to and interposed between a gate electrode of the driving transistor and the power source line,
   the capacitative element overlapping the first electrode and disposed between the first electrode and the substrate in the pixel display part.

4. The electro-optical device of claim 1, further comprising:
   a scanning line and a signal line crossing the scanning line, the power source line being parallel to the scanning line.

5. The electro-optical device of claim 4, wherein the scanning line and the power source line are formed by the same layer.

6. The electro-optical device of claim 4, wherein the switching element is formed between the scanning line and the power source line.

7. The electro-optical device of claim 4, wherein a reflecting portion formed by a same layer as the scanning line is formed under the first electrode, and the first electrode and the reflecting portion are connected to each other.

8. The electro-optical device of claim 7, further comprising:
   a first insulating film having an opening portion on the first electrode to define the light emitting layer, and
   a second insulating film under the first insulating film between the second electrode and the signal line,
   wherein the opening portion and the power source line overlap, and
   wherein the second insulating film is not between the first electrode and the reflecting portion.

9. The electro-optical device of claim 1, further comprising:
   a scanning line and a signal line crossing the scanning line, the power source line being parallel to the signal line.

10. The electro-optical device of claim 9, wherein the signal line and the power source line are formed by the same layer.

11. The electro-optical device of claim 9, further comprising:
   an insulating film having an opening portion on the first electrode to define the light emitting layer, the opening portion and the power source line overlapping each other, wherein the switching element is arranged under the insulating film at a surrounded position between the signal line and the opening portion.

12. The electro-optical device of claim 1, wherein the anode is transparent.

13. An electronic device, comprising:
the electro-optical device as set forth in claim 1.

14. The electro-optical device of claim 3, wherein:
the driving transistor has a gate electrode and a first silicon layer,
the capacitative element has a third electrode electrically connected to the power source line and a fourth electrode,
the third electrode is a second silicon layer that is formed in the same layer as the first silicon layer of the transistor, and
the fourth electrode is a first metal layer that is formed in the same layer as the gate electrode of transistor.

15. The electro-optical device of claim 3, further comprising:
a gate-insulating layer and a first interlayer insulating layer, the gate-insulating layer and first interlayer having a contact hole,
the driving transistor having a gate electrode and a first silicon layer,
the capacitative element having a third electrode being a second silicon layer, and a fourth electrode,
the first silicon layer and the second silicon layer being provided between the substrate and the gate-insulating layer,
the gate electrode and fourth electrode being provided between the gate-insulating layer and first interlayer insulating layer,
the first interlayer insulating layer being provided between the fourth electrode and the part of the power source line,
the power source line being connected to the second silicon layer through the contact hole.

16. The electro-optical device of claim 15, wherein:
the contact hole does not overlap the pixel display part in plan view.

17. An electro-optical device, comprising:
a substrate;
a functional layer having a light-emitting layer disposed in a pixel display part;
a first electrode disposed above the substrate, the first electrode being an anode;
a second electrode disposed so that the light emitting layer is disposed between the first electrode and the second electrode, the second electrode being a cathode;
a driving transistor;
a power source line configured to supply the current to the first electrode through the driving transistor, the power source line being disposed under the first electrode and second electrode, and the power source line substantially overlapping the first electrode in an entire portion of the pixel display part; and
a capacitive element electrically connected to a gate electrode of the driving transistor, the capacitive element overlapping the power source line and the first electrode.

18. The electro-optical device of claim 17, the capacitive element further comprising a third electrode and a fourth electrode, the third electrode being electrically connected to the power source line.

19. The electro-optical device of claim 17, the capacitive element further comprising a third electrode and a fourth electrode, a portion of the power source line being the third electrode.

20. An electro-optical device, comprising:
a substrate;
a functional layer having a light-emitting layer disposed in a pixel display part;
a first electrode disposed above the substrate, the first electrode being an anode;
a second electrode disposed so that the light emitting layer is disposed between the first electrode and the second electrode, the second electrode being a cathode;
a driving transistor that controls a current to the first electrode; and
a power source line configured to supply the current to the first electrode, the power source line being electrically connected to the driving transistor and being disposed under the first and second electrodes, and the power source line substantially overlapping an entire portion of the pixel display part.

21. An electro-optical device, comprising:
a substrate;
a light-emitting film;
a first electrode disposed above the substrate, the first electrode being an anode;
a second electrode disposed so that the light emitting layer is disposed between the first electrode and the second electrode, the second electrode being a cathode;
a power source line; and
a driving transistor that controls an electrical connection between the power source line and the first electrode based on a data signal,
the power source line overlapping an entire portion of the light-emitting film.

22. The electro-optical device according to claim 21, the power source line being configured such that the power source line reflects a light emitted by the light-emitting film.

* * * * *